United States Patent
Goldbach et al.

(10) Patent No.: US 7,183,156 B2
(45) Date of Patent: Feb. 27, 2007

(54) TRANSISTOR STRUCTURE, MEMORY CELL, DRAM, AND METHOD FOR FABRICATING A TRANSISTOR STRUCTURE IN A SEMICONDUCTOR SUBSTRATE

(75) Inventors: Matthias Goldbach, Dresden (DE); Ulrich Frey, Dresden (DE); Björn Fischer, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/975,085

(22) Filed: Oct. 28, 2004

(65) Prior Publication Data

US 2005/0116293 A1    Jun. 2, 2005

(30) Foreign Application Priority Data

Oct. 31, 2003    (DE) ................. 103 51 030

(51) Int. Cl.
*H01L 21/8242* (2006.01)

(52) U.S. Cl. ............. 438/248; 438/243; 438/E21.008

(58) Field of Classification Search ......... 438/286, 438/239–254, 300–305, 257–265, E21.008
See application file for complete search history.

(56) References Cited

U.S. PATENT DOCUMENTS

| 4,852,062 | A | | 7/1989 | Baker et al. |
| 5,684,317 | A | | 11/1997 | Hwang |
| 5,741,737 | A | * | 4/1998 | Kachelmeier ............ 438/286 |
| 5,837,584 | A | | 11/1998 | Lu et al. |
| 5,963,808 | A | | 10/1999 | Lu et al. |
| 6,207,516 | B1 | * | 3/2001 | Tang ..................... 438/301 |

* cited by examiner

*Primary Examiner*—Cuong Nguyen
(74) *Attorney, Agent, or Firm*—Edell, Shapiro & Finnan, LLC

(57) ABSTRACT

Transistor structures, with one source/drain region connected to a charge storage device to be insulated includes an asymmetric gate conductor structure. At a first side wall, which faces the one source/drain region, the asymmetric gate conductor structure has a side wall oxide with a greater thickness and a bird's beak structure with a greater length than at an opposite, second side wall. An effective channel length is increased for the same feature size of the gate conductor structure. Memory cells can be realized in a higher density.

9 Claims, 20 Drawing Sheets

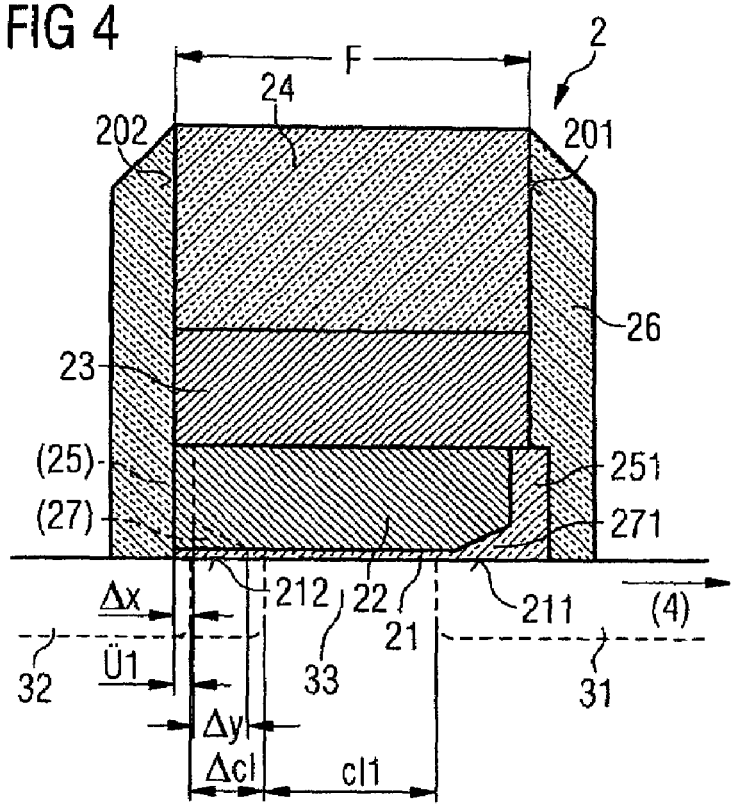
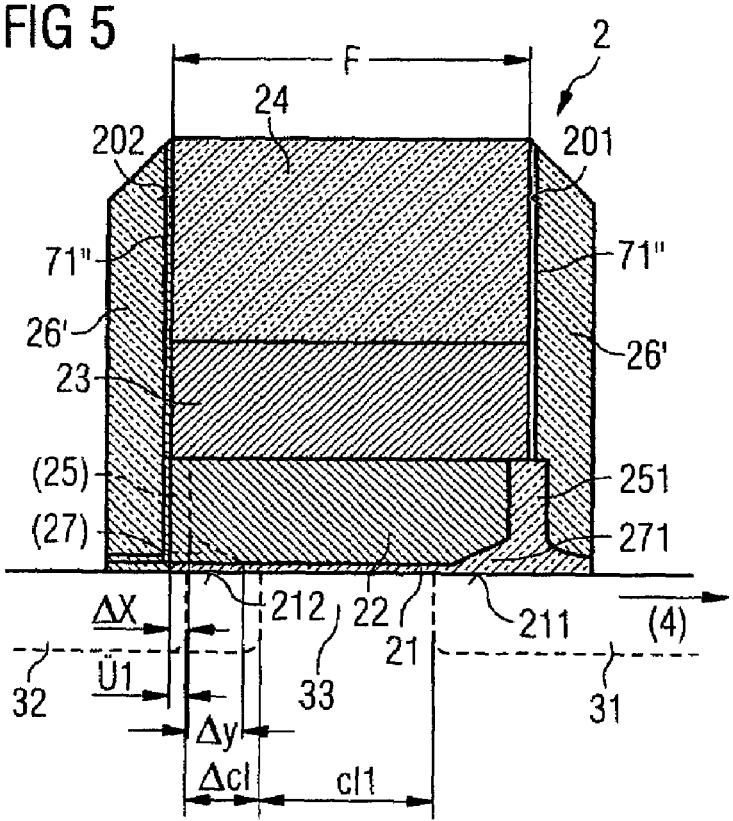

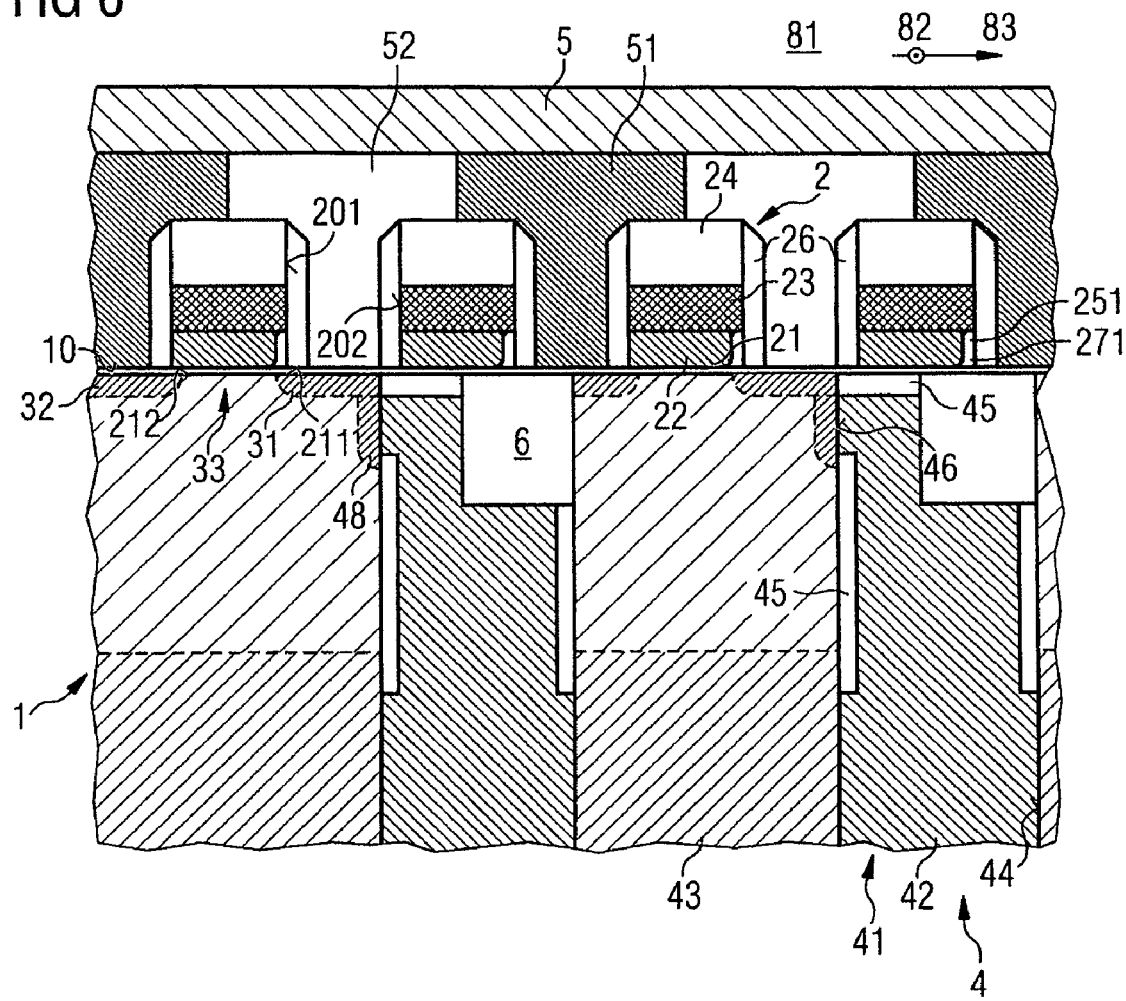

TRANSISTOR STRUCTURE, MEMORY CELL, DRAM, AND METHOD FOR FABRICATING A TRANSISTOR STRUCTURE IN A SEMICONDUCTOR SUBSTRATE

CROSS REFERENCE TO RELATED APPLICATIONS

This application claims priority under 35 USC §119 to German Application No. DE 103 51 030.3, filed on Oct. 31, 2003, and titled "Transistor Structure, Memory Cell, DRAM and Method for Fabricating a Transistor Structure in a Semiconductor Substrate," the entire contents of which are hereby incorporated by reference.

FIELD OF THE INVENTION

The invention relates to a transistor structure, a memory cell, a DRAM, and a method for fabricating a transistor structure.

BACKGROUND

FIG. 2 diagrammatically depicts a conventional transistor structure, which is oriented at a substrate surface 10 of a semiconductor substrate 1, for integrated circuits. The transistor structure is a field-effect transistor with two source/drain regions 31, 32 formed as doped regions beneath the substrate surface 10 in the semiconductor substrate 1. The two source/drain regions 31, 32 are spaced apart from one another by a channel region 33, which is either not doped or is doped by a conductivity type opposite the conductivity type of the source/drain regions 31, 32. A gate dielectric 21 is provided on the substrate surface 10 substantially above the channel region 33. A base portion 22, a highly conductive portion 23, and an insulator portion 24 of a gate conductor structure 2 adjoin the gate dielectric 21 in a vertical direction with respect to the substrate surface 10. The gate conductor structure 2 is surrounded by gate stack spacers 26 at side walls 20 oriented vertically with respect to the substrate surface 10.

The gate conductor structure 2 is produced during a lithographic process by patterning of a layer stack formed from the material of the base portion 22, the conductive material of the highly conductive portion 23, and the insulator material of the insulator portion 24. In this example, the material of the base portion is polysilicon. A width of the gate conductor structure 2 can correspond to a minimum feature size F, which is predetermined by the manufacturing process. In this context, the minimum feature size F denotes the width of the smallest lithography resolution unit. The gate stack spacers 26 are produced from a sublithographic process, for example, by non-isotropic etchback of a conformally deposited spacer material.

If the transistor structure is used to isolate a structure adjoining a first source/drain region, with the minimum possible leakage current over a prolonged period of time and to occasionally connect the structure to a driver or data line connected to the second source/drain region 32, the side walls 20 of the gate conductor structures 2 at least in the base portion 22 are subject to an oxidation process. This produces dielectric side wall oxides 25 at the side walls 20 in the region of the base portion 22. Incorporation of oxygen causes the base portions 22 to thicken. Since the oxide grows relatively more quickly along an existing oxide layer, gate dielectric portions 27, which thicken outward, for example, in the shape of a wedge in the direction of the side walls 20 or the source/drain regions 31, 32, also referred to below as bird's beak structures 27, are formed between the base portion 22 and the gate dielectric 21 below. The side wall structures 25 and the bird's beak structures 27 reduce a leakage current between the source/drain regions 31, 32 to the gate conductor structure 2 and a leakage current brought about by the GIDL (gate induced drain leakage) effect.

The oxidation process reduces the gate dielectric 21 by an amount 2* Δx due to oxidation of the side wall oxides 25 and by an amount 2* Δy as a result of the bird's beak structures 27. The effective channel width of the transistor structure illustrated is CL1. An overlap between the gate dielectric 21, including the bird's beak structures 27, and the source/drain regions 31, 32 is Ü1.

In the off state of the transistor structure, the source/drain regions 31, 32 are isolated from one another. A conductive channel between the two source/drain regions 31, 32, which bridges the channel region 33, is formed in a portion of the semiconductor substrate 1 which adjoins the gate conductor dielectric 21 by a potential at the conductive portions of the gate conductive structure 2.

Transistor structures, which can temporarily isolate an insulated structure connected to one of their two source/drain regions at a very low leakage current include, for example, transistors in the hold elements of A/D converters and select transistors of dynamic memory cells. Memory cells of dynamic random access memories (DRAMs) in each case can include a storage capacitor for storing an electric charge, which is characteristic of a data content of the memory cell, and a select transistor for addressing the storage capacitor. The storage capacitor is the structure to be isolated. One electrode (storage electrode) is connected to the first source/drain region of the select transistor.

In the case of trench capacitors, the storage capacitor is formed within the semiconductor substrate beneath the substrate surface. The select transistors are formed next to one another along the substrate surface of the semiconductor substrate. The source/drain regions and the channel region are provided as doped regions in the semiconductor substrate. The gate dielectric and a gate conductor structure are arranged above the substrate surface in the region of the channel region.

FIG. 1 illustrates a portion of a cell array 81 of a DRAM that is formed from a plurality of memory cells 8. In the cell array 81, the memory cells 8 are arranged in cell rows 82 and cell columns 83 that are orthogonal to the cell rows 82. FIG. 1 illustrates four cell rows 82 in cross section. Each memory cell includes a storage capacitor 4 and a select transistor 3. The memory cells 8 of adjacent cell rows 82 are offset with respect to one another by half the distance between memory cells. FIG. 1 illustrates two memory cells 8 in cross section.

The memory cells 8 are oriented to a trench 41 introduced into a semiconductor substrate 1 from a substrate surface 10. The trench 41 is lined with a capacitor dielectric 44 in a lower portion and with a collar insulator 45 in an upper portion. The capacitor dielectric 44 isolates a storage electrode 42 provided in the interior of the trench 41 as a filling. The filling includes a conductive semiconductor material, counterelectrode 43, is formed as a doped region in the semiconductor substrate 1 surrounding the trench 41 in a lower portion. The collar insulator 45 insulates the storage electrode 42 from an upper portion of the semiconductor substrate 1, in which source/drain regions 31, 32 of the select transistor 3 are formed.

The two source/drain regions 31, 32 of the select transistor 3 are spaced apart from one another by a channel region 33. A gate dielectric 21 is formed above the channel region 33. The gate conductor structure 2 adjoins the gate dielectric 21 in a direction which is vertical with respect to the substrate surface 10. The gate conductor structure 2 includes a base portion 22, which adjoins the gate dielectric 21, a highly conductive portion 23, which adjoins the base portion 22, and an insulator portion 24, which is a covering. Side wall oxides 25 are provided at the side walls 20 of the gate conductor structure 2 in the base portion 22. The gate dielectric 21 includes bird's beak structures 27. In the region of a buried strap window 46, the storage electrode 42 adjoins a buried strap outdiffusion 48, which connects to a first source/drain region 31 of the select transistor 3 respectively assigned to the storage capacitor 4. The storage electrode 42 is isolated from the adjacent memory cell 8' by a shallow insulator structure 6 (STI, shallow trench isolation).

The select transistors 3 or gate conductor structures 2, which are grouped together to form a cell row 82, are connected to one another and form address or word lines 53 running parallel to the cell row 82. When the memory device is operating, the word lines 53 are driven by logic arranged outside the cell array 81 so as to address memory cells 8. Bit or data lines 5, which are connected to the second source/drain region 32 of the select transistor 3 via data line contacts 51, are arranged transversely with respect to the word lines 53 formed by the gate conductor structures 2 arranged next to one another and adjoining one another. A covering oxide (i.e., TTO, trench top oxide) 47 insulates the storage electrode 42 from the respectively passing, inactive word line 53 or gate conductor structure 2.

In general terms, it is desired to reduce the size of transistor structures without any adverse effect on functionality. In the case of planar transistor structures, smaller feature sizes lead to shorter distances between the two source/drain regions of the transistor structure and to shorter channel lengths of a channel formed in the channel region between the two source/drain regions. However, with minimum feature sizes of less than 100 nanometers, a shortening of the channel length corresponding to a reduction in the minimum feature size leads to disproportionately greater difficulties in connection with a lower storage voltage then being required and/or with realizing a suitable doping profile of the channel region.

When reducing the size of memory cells having a storage capacitor and a select transistor, it is generally aimed to minimize leakage currents flowing away from the storage electrode for predetermined horizontal dimensions.

A transistor structure with a leakage current from a storage structure, which is to be isolated and connected to one of the source/drain regions of the transistor structure, which is reduced compared to known transistor structures for the same dimensions is desirable. Furthermore, a memory cell with a low leakage current, a DRAM and a method for fabricating a transistor structure of this type is desirable.

SUMMARY

The invention relates to a transistor structure, having in each case a first and second source/drain region formed beneath a substrate surface of a semiconductor substrate as a region doped by a first conductivity type, a channel region, which spaces the two source/drain regions apart from one another and is formed as a region which is not doped or is doped by a second conductivity type, which is the opposite type to the first conductivity type, a gate dielectric which is provided above the substrate surface substantially in the region of the channel region, a gate conductor structure, which is provided on the gate dielectric and has a base portion made from a conductive material adjoining the gate dielectric, and side wall oxides in side wall portions of the base portion which are substantially vertical with respect to the substrate surface.

A transistor structure has two source/drain regions, which are separated from one another by a channel region. The two source/drain regions are formed as regions doped by a first conductivity type in a semiconductor substrate. The channel region formed between the two source/drain regions is not doped or is doped by a second conductivity type, which is opposite the first conductivity type. In the region of the channel region, a gate conductor structure, which is separated from the semiconductor substrate and the channel region formed therein by a gate dielectric resting on the substrate surface, is provided above the substrate surface. In the gate conductor structure, a base portion made from a conductive material adjoins the gate dielectric. In the region of the base portion, side wall oxides are provided at side wall portions of the base portion, which are substantially vertical with respect to the substrate surface.

In such a transistor structure, a first side wall oxide, which is oriented to the first source/drain region, has a layer thickness, which is, for example, at least 10% higher than that of a second side wall oxide, which is oriented to the second source/drain region, and/or a first gate dielectric portion, which is thickened in the shape of a wedge (bird's beak structure) and is oriented to the first source/drain region, underpins the gate conductor structure to a width, which is, for example, more than 10% greater than a second gate dielectric portion thickened in the shape of a wedge and oriented to the second source/drain region.

In a number of applications for transistor structures which isolate a binary or analog storage structure in the switched-off state, the second source/drain region, which is not connected to the storage structure, is connected to a structure whose potential is determined by a source. A leakage current which results from an overlap between the gate dielectric and the second source/drain region, for example, on the order of magnitude of a few femtoamperes, can generally be disregarded. A side wall oxide on the side of the second source/drain region, which initially reduces the length of the active gate portion, is relatively superfluous on this side of the transistor structure.

A transistor structure according to the invention differs from a conventional transistor structure for the same feature size in that the active gate length of the transistor structure according to the invention is reduced by a thickness by which the side wall oxide grows at the expense of the base portion. If, as a result, a transition between the second source/drain region and the channel region is additionally shifted outward toward the second source/drain region, the transistor structure according to the invention has an effective channel length, which is increased by the same amount. The side wall oxide is formed in a known way on the side facing the first source/drain region. The side wall oxide, which is provided on this side of the transistor structure in the same layer thickness as in conventional transistor structures, reduces the leakage currents from and to the structure to be isolated.

In the case of a transistor structure as illustrated in FIG. 2, standard processing operations with a reduction in the side wall oxide also entail a reduction in the size of the bird's beak structure. Depending on the precise form of processing deployed, a transistor structure according to the invention includes, either as an addition or an alternative to the first feature of the asymmetrical side wall oxide, bird's beak structures as gate dielectric portions which become thicker in the shape of a wedge toward the second source/drain region and a length which is approximately 10% shorter than that of the bird's beak structure on the side facing the first source/drain region.

In conventional structures, the gate length is reduced by 5 to 15% as a result of the side wall oxide and the bird's beak structure. If the side wall oxide and the bird's beak structure is designed to be 10% lower on one side, the transistor structure according to the invention has an effective channel length which is approximately 1% higher.

In one instance, the first side wall oxide, which is oriented to the first source/drain region, has a layer thickness which is more than 50% higher than that of the side wall oxide, which is oriented to the second source/drain region. In terms of fabrication technology, such a reduction can be achieved relatively simply and the effective channel length is increased by approximately 10%. Alternatively, if the same effective channel length is retained, more space is provided for contact structures to be formed between the gate conductor structures.

In addition to the base portion, which is formed from doped polysilicon or a metal, the gate conductor structure may also have a highly conductive portion resting on the base portion. The highly conductive portion includes, for example, tungsten, tungsten silicide or tungsten nitride, or includes a layered stack of a plurality of materials including one or more of the materials mentioned above.

The highly conductive portion reduces the resistance of the supply to the gate electrode, and therefore, the response time of the transistor structure. An insulator portion made from a dielectric material, for example, silicon nitride, adjoins the highly conductive portion in a direction which is vertical with respect to the substrate surface. The insulator portion insulates the gate conductor structure from a metallization level, which is to be provided above the gate conductor structure. The gate conductor structure has gate stack spacers at vertical side walls. The gate stack spacers insulate the gate conductor structure from contact structures. For example, the source/drain regions formed in the semiconductor substrate are connected to the metallization level to be provided above the gate conductor structures via the contact structures.

The source/drain regions of the transistor structure according to the invention can be formed asymmetrically. In this case, both source/drain regions initially originate from a virtually vertical implantation of a dopant of the first conductivity type, for instance, of the n-conducting type. Oblique implantation with a dopant of the second conductivity type as counter-implantation partially compensates for the first implantation in the region of the second source/drain region. In conjunction with the transistor structure according to the invention, the oblique implantation allows transition between the second source/drain region and the channel region to be drawn back toward the second source/drain region.

Therefore, the first source/drain region, for instance, underpins the gate conductor structure to a greater width than the second source/drain region.

The side wall oxide can be provided, for example, by depositing an oxide. The side wall oxide can be grown by a thermal oxidation process.

The transistor structure is suitable for applications in which a charge storage device is accessed via a transistor. An electric charge stored on the charge storage device is to be isolated as successfully as possible and without leakage currents in the switched-off state of the transistor structure.

Examples include, for example, hold elements in analog circuits, such as, for example, A/D converters, and memory cells of dynamic random access memories. Since-forming the side wall oxide or the bird's beak structure on one side entails additional outlay in terms of process engineering, in applications having a large number of transistor structures, the transistor structure provides a possible increase of the gate or channel length while retaining the same feature size or the space which can be used to form contact structures between the gate conductor structures, if the same gate or channel length is retained.

A memory cell according to the invention for storing binary information therefore has a storage capacitor for storing an electric charge, which corresponds to the binary information and a select transistor with a source/drain section connected in series with the storage capacitor. A first source/drain region of the select transistor is connected to a storage electrode of the storage capacitor. A second source/drain region of the select transistor is connected to a bit line, and a gate conductor structure is connected to an address line. The select transistor is controlled by a potential at the address line and switches between the conducting state and the blocking state according to the potential at the address line. In the conducting state, either a charge which is driven on the bit line is passed to the storage electrode of the storage capacitor, or the charge stored on the storage capacitor is released to the bit line and for further evaluation. In the blocking state of the select transistor, the charge stored on the storage capacitor is relatively frozen.

The memory cell according to the invention has a select transistor with the transistor structure according to the invention. The memory cells may either be more densely integrated or may be provided with a gate or channel length of the select transistor which is increased compared to conventional arrangements, in which case leakage currents, which are linked, in particular, to an overlap region between the gate dielectric and the first source/drain region oriented to the storage capacitor are not increased.

In a first embodiment of the memory cell according to the invention, the storage capacitor is formed beneath the substrate surface of the semiconductor substrate. A storage electrode of the storage capacitor is provided as a filling. The storage electrode includes a conductive material. Portions of the trench are lined with a capacitor dielectric. A portion of the semiconductor substrate, which surrounds the trench, is formed as a doped, conductive region and represents a counterelectrode to the storage capacitor formed as a trench capacitor.

According to a second embodiment of the memory cell according to the invention, the electrodes of the storage capacitor are provided above the substrate surface. The storage electrode is connected to the first source/drain region of the select transistor and is arranged above the substrate surface. A capacitor dielectric is provided at least on portions of the storage electrode, and in turn a counterelectrode of the storage capacitor, which is then formed as a stacked capacitor, is formed at least on portions of the capacitor dielectric.

A DRAM according to the invention for storing binary information has a plurality of identical memory cells arranged in a memory cell array. Each memory cell includes a storage capacitor for storing an electric charge, which corresponds to the stored binary information, and a select transistor. In the on or conducting state, the select transistor connects a storage electrode of the storage capacitor to the data line. The state of the select transistor switches as a function of a potential at an address line. The memory cells are arranged in cell rows and cell columns, which are arranged at right angles with respect to the cell rows.

A DRAM according to the invention has memory cells according to the invention. The gate conductor structures of select transistors that neighbor one another along one of the cell rows being connected to one another adjoin one another, and form the associated address line.

Within the cell array, the gate conductor structures of adjacent select transistors within a cell row form webs, so that the gate conductor structures have two opposite side walls. The gate conductor structures, which are connected to one another, are generally arranged in cell rows located next to and running parallel to one another. The first and second source/drain regions are arranged oriented with respect to the gate conductor structures. In a checker board layout which is known for memory cells, the first source/drain regions of the memory cells of a cell array lie on the same side. In accordance with the method of the invention for fabricating a transistor structure, a gate dielectric layer is provided at least on portions of a substrate surface of a semiconductor substrate, and a base layer of a conductive material is applied to the gate dielectric layer and patterned, with a base portion of a gate conductor structure being produced from the base layer. An oxide layer, which is asymmetric in form, is provided at the side walls of the base portion, which are substantially vertical with respect to the substrate surface. In this case, a first side wall oxide, which is provided at a first side wall of the base portion, has a relatively larger layer thickness than a second side wall oxide that is provided at a second side wall on the opposite side from the first side wall.

In this case, for instance, the side wall oxide can be grown by an oxidation process acting on the conductive material of the base portion.

As an alternative or in addition, the asymmetric control of the oxidation process forms a first gate dielectric portion, or bird's beak structure, which is thickened in the shape of a wedge and oriented to the first side wall of the base portion, formed with a relatively higher layer thickness and/or length than a second gate dielectric portion, or bird's beak structure, which is thickened in the shape of a wedge and is oriented to the second side wall.

In a first embodiment of the method according to the invention, the higher oxidation rate at the second side wall and/or in the second dielectric portion is achieved by a dopant which inhibits the oxidation process is implanted by oblique implantation. For this purpose, the oblique implantation is carried out at an angle at which the second side wall and/or the second dielectric portion experiences relatively higher implantation than the first side wall and/or the first dielectric portion. If the base portion includes a polysilicon, the oxidation rate can be reduced by the implantation of nitrogen. If the gate dielectric layer is made from silicon oxide, the growth of the silicon oxide can likewise be reduced by implantation with nitrogen.

According to a second embodiment of the method according to the invention, a mask, which covers at least the second side wall and/or the second dielectric portion but does not cover at least the first side wall and/or the first dielectric portion is produced at the side wall and/or in the gate dielectric prior to the oxidation process.

After the oxidation process, portions of the mask, which are horizontal to the substrate surface are removed again.

To produce the mask, a photoresist layer is applied and the photoresist layer is patterned in a photolithographic process. A patterned photoresist mask is produced from the photoresist layer.

Alternatively, to produce the mask a photoresist layer is applied and then an etching resistance of the photoresist layer is reduced by oblique exposure in portions, which lie in the beam path of an exposure source while remaining unchanged in the unexposed portions covered from the oblique exposure by the gate conductor structure. Then, the exposed portions of the photoresist layer are caused to recede selectively with respect to the unexposed portions. A patterned photoresist mask is formed from the photoresist layer.

According to a further embodiment of the method according to the invention, a conformal mask layer is applied in order to produce the mask. The etching resistance of the mask layer is selectively altered by an α-oblique implantation on the first side wall and/or in the first dielectric portion. The unaltered portions of the conformal mask layer are caused to recede selectively with respect to the altered portions. The mask is produced from the remaining portions of the mask layer.

The mask produced using one of the methods described above can be used directly as a mask for the formation of the side wall oxide. However, in particular, in connection with thermal formation of the side wall oxide to produce the mask, for instance, a temperature-resistant interlayer is provided, and after the photoresist mask or the patterned mask layer has been produced, the interlayer is patterned in accordance with the photoresist mask or the patterned mask layer. The oxidation process can be carried out in a manner masked by the patterned temperature-resistant interlayer. Silicon nitride, which can mask the side wall oxidation process, is, for example, selected as material for the patterned interlayer.

The patterned interlayer, for instance, can be provided such that portions of the first side wall of the gate conductor structure, which are formed by the highly conductive portion, are covered by the interlayer. The highly conductive portion of the gate conductor structure can be shielded from the oxidation process, in particular, if the highly conductive portion is formed from tungsten or tungsten nitride.

A neighboring structure, for instance, can be provided on that side of the gate conductor structure, which is predetermined by the first side wall of the gate conductor structure, at a distance on the order of magnitude of the width of the gate conductor structure. The neighboring structure is a further gate conductor structure or an auxiliary structure provided for this purpose. The etching resistance of the mask layer can then be selectively altered by a β-oblique implantation, which is directed oppositely to the α-oblique implantation with respect to the vertical direction, on the first side wall outside the base portion. The neighboring structure prevents the implantation of a portion, adjoining the gate dielectric, of the mask layer covering the base portion on the second side wall.

BRIEF DESCRIPTION OF THE DRAWINGS

The invention and its features are diagrammatically depicted, for example, in diagrammatic cross sections through transistor structures and memory cells. Parts and components which correspond to one another are provided with identical reference numerals throughout these figures. In the diagrammatic cross sections:

FIG. 4 shows a second exemplary embodiment of a transistor structure according to the invention, FIG. 5 shows a third exemplary embodiment of a transistor structure according the invention, FIG. 6 shows a portion of a memory cell array in accordance with a first exemplary embodiment in the checker board layout, FIGS. 12A, 12B and 11C show an arrangement with transistor structures in three phases of a third exemplary embodiment of the method according to the invention.

DETAILED DESCRIPTION

Figure 3:
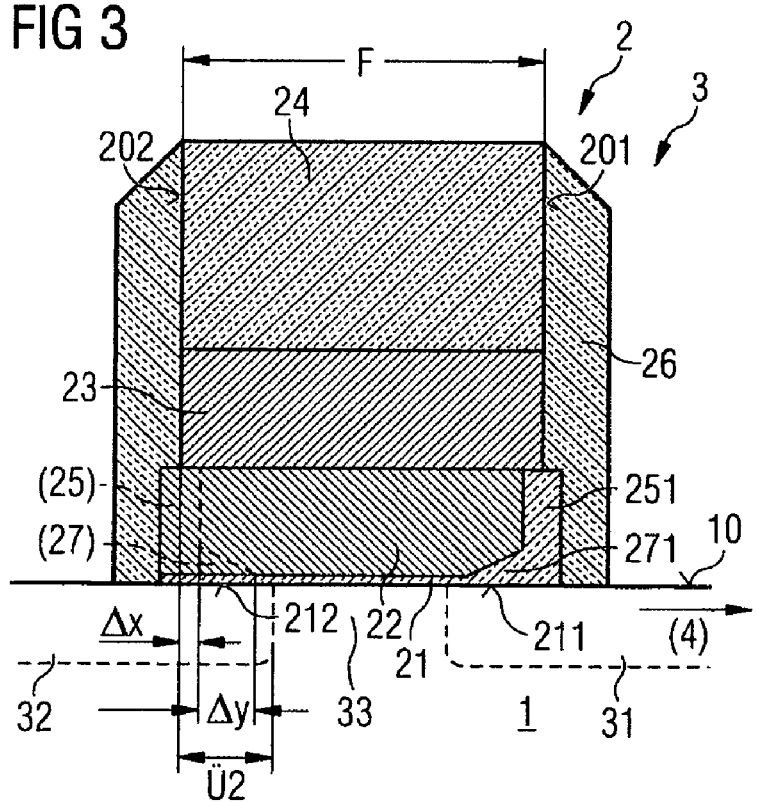
FIG. 3 shows a first exemplary embodiment of a transistor structure according to the invention.

FIG. 3 illustrates a cross section through a transistor structure according to the invention. A semiconductor body of the transistor structure, formed from a first source/drain region 31, a second source/drain region 32, and a channel region 33 arranged between the two source/drain regions 31, 32, is formed in a monocrystalline semiconductor substrate 1 beneath a substrate surface 10. The first source/drain region 31 is connected to a structure to be insulated, for example, a storage capacitor 4. A gate conductor structure 2, which is insulated from the semiconductor substrate 1 by a gate dielectric 21, is formed over the substrate surface 10 approximately above the channel region 33. In this exemplary embodiment, the gate conductor structure 2 includes a base portion 22, which adjoins the gate dielectric 21, a highly conductive portion 23, which rests on the base portion 22, and an insulator portion 24 which covers the gate conductor structure 2. Further identical transistor structures 3 adjoin the transistor structure 3 in the direction perpendicular to the cross section, the active areas of adjacent transistor structures being insulated from one another. The gate conductor structures 2 of the transistor structures, which neighbor one another in this way adjoin one another, are conductively connected to one another and in each case form line portions of a common address line 53. A first side wall 201 is formed to the first source/drain region 31, which is connected to the structure 4 to be insulated, and a second side wall 202, on the opposite side from the first side wall 201, is formed. Along the side walls 201, 202, the gate conductor structure 2 is covered by gate stack spacers 26. The gate stack spacers 26 and the insulator portion 24 are, for instance, formed from silicon nitride. The material of the highly conductive portion 23 is, for example, tungsten, tungsten silicide and/or tungsten nitride. The materials, which form the highly conductive portion 23, may also form a layer stack.

In the region of the side wall 201 facing the first source/drain region 31, the transistor structure has, in the base portion 22, a side wall oxide 251 and a gate dielectric portion 271, which is thickened in the shape of a wedge in the direction of the first side wall 201 (bird's beak structure). An effective gate length is reduced compared to conventional transistor structures with side wall oxide 251 and/or bird's beak structure 271 formed on both sides. The additional effective gate length obtained is composed of a component Δx, which results from dispensing with the second side wall oxide 252, and a component Δy, which results from dispensing with the second bird's beak structure 272. The result is an overlap region of length Ü2 between the gate dielectric 21 and the second source/drain region 32.

Figure 2:
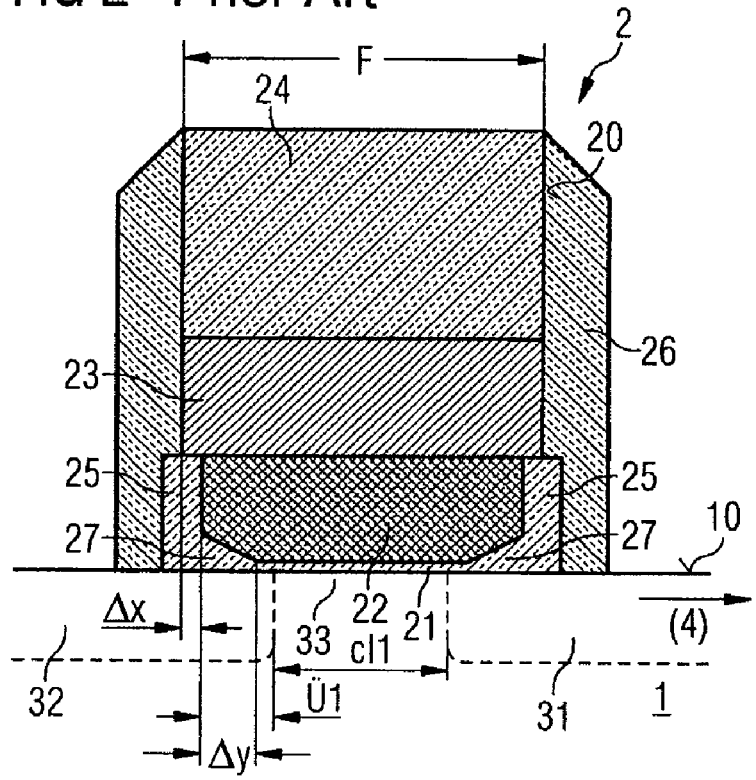
FIG. 2 shows a conventional transistor structure.

In a second embodiment of the transistor structure, as illustrated in FIG. 4, the overlap region Ü2 is returned to the conventional dimension Ü1 in accordance with FIG. 2. This is effected, for example, by an angled counter-implantation to dope the source/drain regions 31, 32. For the example shown in FIG. 4, the oblique implantation would be carried out from the top left to the bottom right using a dopant of a second conductivity type, which is opposite a first conductivity type of the source/drain regions 31, 32. The transistor structure shown in FIG. 4 then has a channel length CL2 between the two source/drain regions 31, 32 which is increased by the amount Δx+Δy compared to the channel length CL1 of a conventional transistor structure for the same width of gate conductor structure 2.

In the case of the transistor structures illustrated in FIGS. 3 and 4, all the mask layers required in the course of the single-sided processing of the side wall oxide 251 or the bird's beak structure 271 are completely removed prior to application of the gate stack spacers 26. In this example, the gate stack spacers 26 are formed from silicon nitride or silicon oxide, in accordance with the prior art.

By contrast, the gate stack spacers 26' shown in FIG. 5, at least in part, are made up of remaining portions of mask structures required for the single-sided or asymmetric processing of the side wall oxide 251 or bird's beak structure 271. The mask structures include, in particular, a remaining interlayer 71". On account of the different form of processing, in this exemplary embodiment, portions of the partially thickened gate dielectric 21 remain in place beneath the gate stack spacers 26'.

Figure 1:
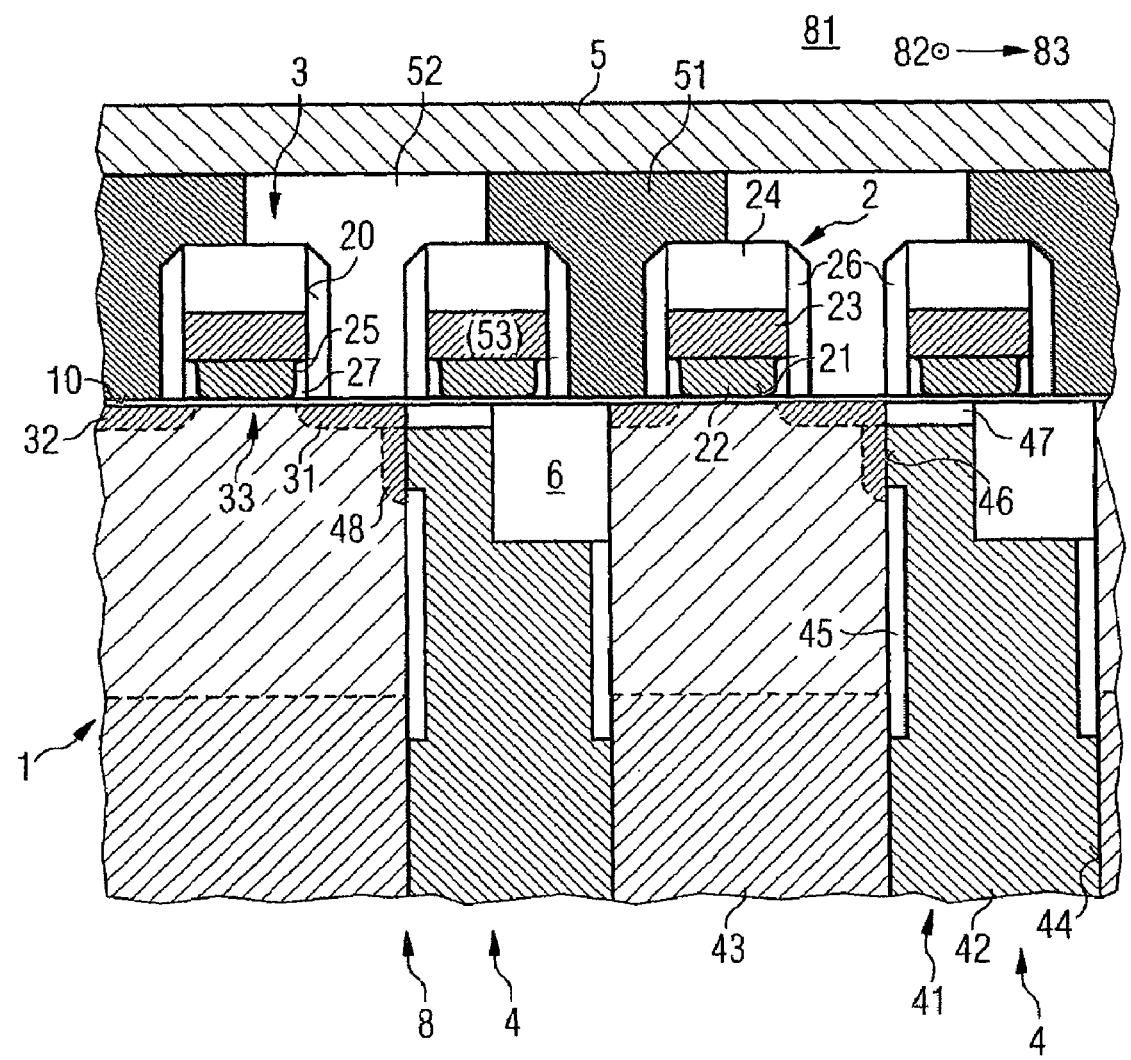
FIG. 1 shows a portion of a conventional memory cell array.

FIG. 6 shows an excerpt from a cell array 81. The memory cells 8 are arranged in cell rows 82. The memory cells 8 of respectively adjacent cell rows 82 are offset with respect to one another at distances corresponding to half a memory cell 8. The memory cell 8 in this case includes a select transistor 3 and a storage capacitor 4. Apart from the fact that the side wall oxide 251 or bird's beak structure 271 is formed on one side, the arrangement illustrated in FIG. 6 corresponds to the arrangement illustrated in FIG. 1. With this layout of the memory cells 8, those side walls 201 which are oriented to the insulating structure, i. e., to the storage capacitor 4, are formed on the right-hand side of the gate conductor structures 2. The side walls 201 are oxidized in the region of the base portion 22. The respectively opposite side walls 202 do not have any side wall oxidation. Accordingly, the gate dielectrics 21 are thickened in the shape of a wedge to produce a bird's beak structure 271 in the first dielectric portion 211 oriented to the first source/drain region 31. The gate dielectric 21 remains unchanged in the second dielectric portion 212 oriented to the second source/drain region 32.

In the overlap region between the gate dielectric 21 and the first source/drain region 31, a leakage current through the gate dielectric 21 or a leakage current to the substrate caused by the voltage at the gate conductor structure 2 is prevented by the formation of the side wall oxide 251 and the bird's beak structure 271.

Figure 7:
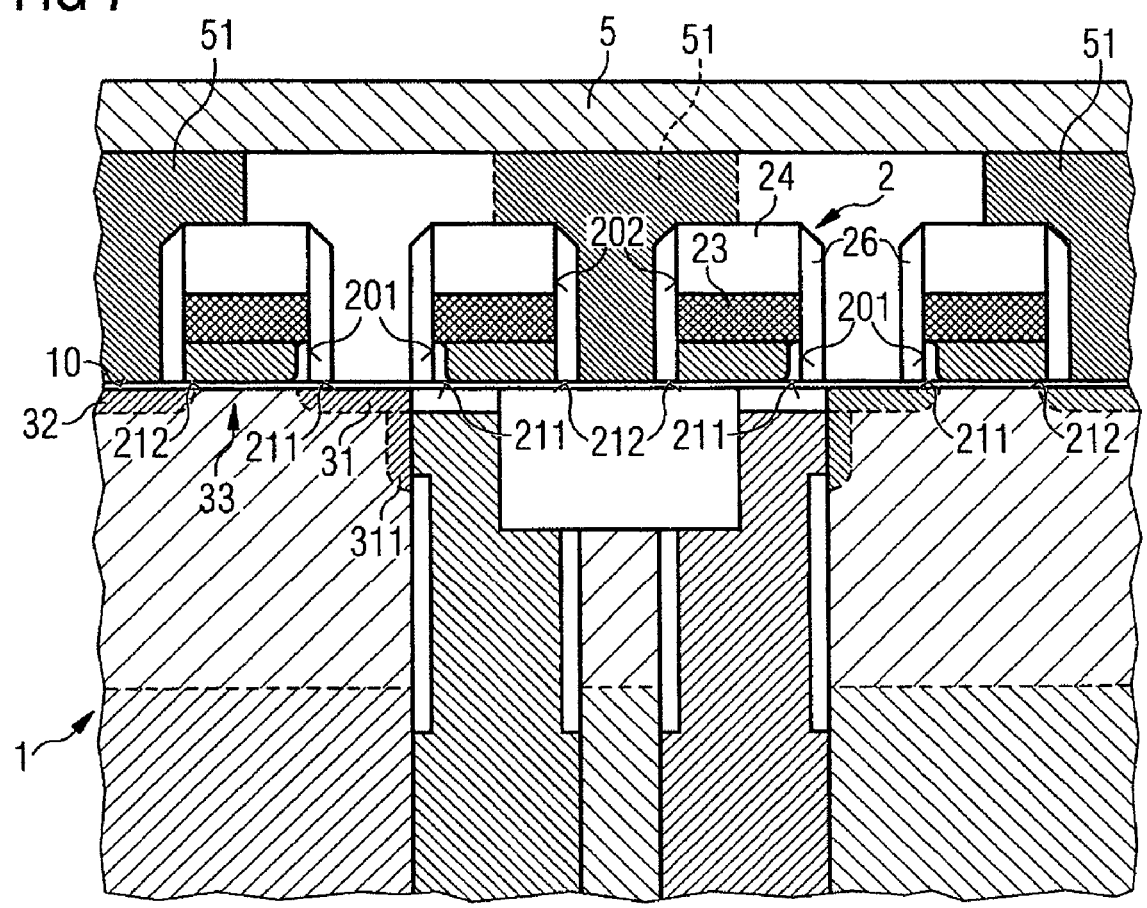
FIG. 7 shows a portion of a memory cell array in accordance with a further exemplary embodiment in the MINT layout.

The cell array corresponding to FIG. 7 is based on a further known layout for memory cells, known as the MINT (merged isolated node trench) layout. In this case, two memory cells are arranged mirror-symmetrically with respect to a plane of symmetry running between them. Accordingly, the side walls 201, facing the first source/drain region 31, of two memory cells 8 that are mirror-symmetrical with respect to one another are in each case on opposite sides. Based on the cell array, for each pair of adjacent gate conductor structures 2, alternately either the first side walls or the second side walls face one another. In each case two adjacent gate conductor structures 2 are connected to a common data line contact 51 which is arranged between them and connects the two source/drain regions 32 of the two gate conductor structures 2 to a common data line 5. Therefore, in the two adjacent gate conductor structures 2, the second side walls 202, at which the side wall oxidation process is to be suppressed, face the data line contact 51.

With this layout, the single-sided side wall oxidation can be realized in a relatively simple way with a relatively uncritical photolithographic mask. The photolithographic mask required for this purpose is the inverse of a mask used to form the data line contacts 51.

Figure 8:
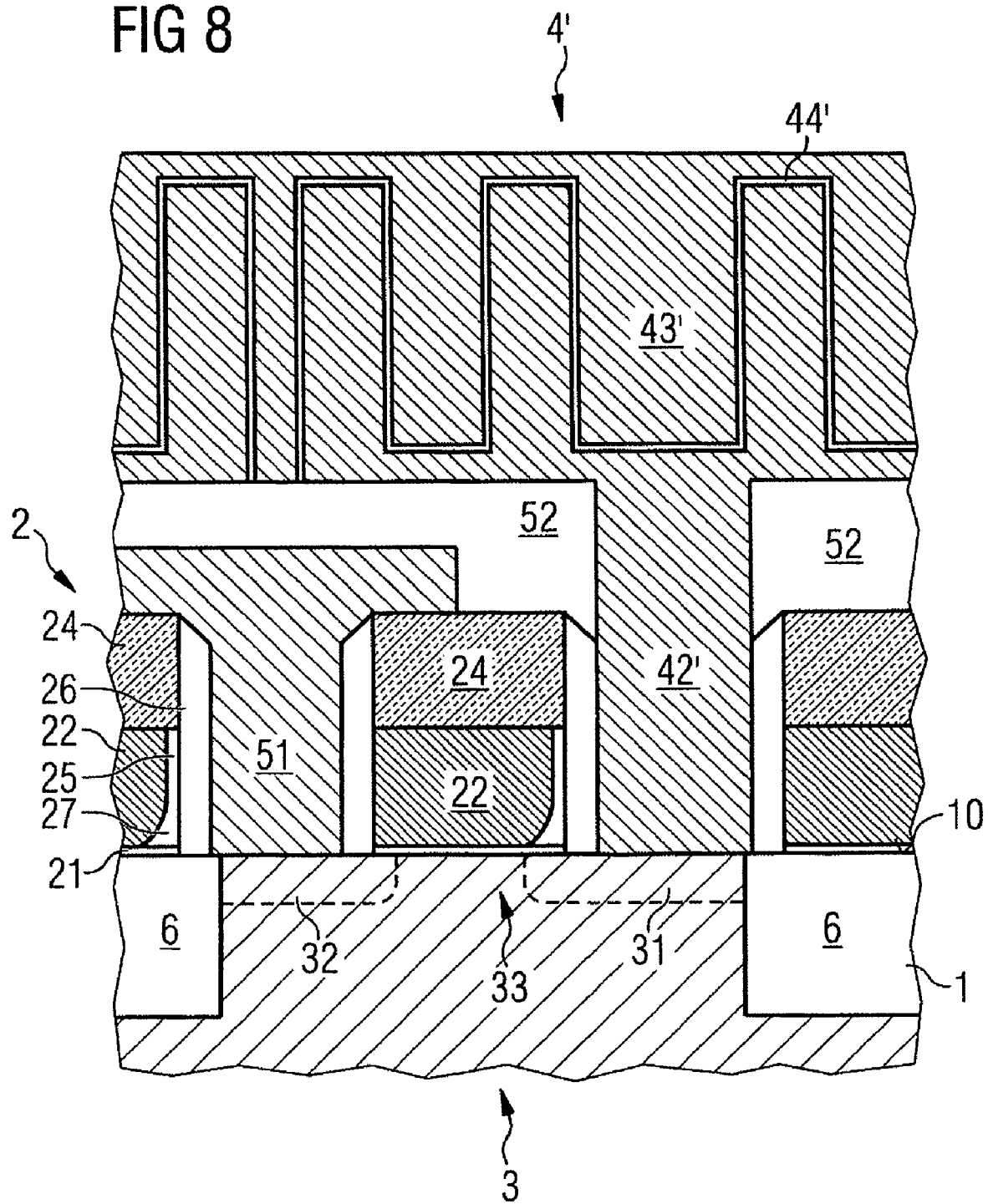
FIG. 8 shows an exemplary embodiment for a memory cell according to the invention with stacked capacitor.

FIG. 8 shows the transistor structure according to the invention in combination with a memory cell with stacked capacitor 4'. An active area of a select transistor 3 of a memory cell 8 is illustrated beneath a substrate surface 10 of a semiconductor substrate 1. The active area of the select transistor 3 includes a first source/drain region 31 and a second source/drain region 32. The two source/drain regions 31, 32 are provided as doped regions. The two source/drain regions 31, 32 are spaced apart from one another by a channel region 33. A gate dielectric 21 is arranged on the substrate surface 10 above the channel region 33. The gate dielectric 21 separates the base portion 22 of a gate conductor structure 2 from the semiconductor substrate 1. An insulator portion 24 rests on the base portion 22 of the gate conductor structure 2. Vertical side walls of the gate conductor structure 2 are covered by gate stack spacers 26. The first source/drain region 31 of the select transistor 3 adjoins a storage electrode 42' of the stacked capacitor 4'. The storage electrode 42' is made, for example, from polysilicon and contact-connects the associated first source/drain region 31 between two adjacent gate conductor structures 2. To increase the capacitance of the storage capacitor 4, the storage electrode 42' has a crown structure and is insulated from a counterelectrode 43' arranged above it by a capacitor dielectric 44'. Beneath the respectively adjacent gate conductor structures 2, the active area is closed off by shallow isolator structures 6 such that the active area is isolated from active areas of further select transistors 3. On the side facing the first source/drain region 31, the base portion 22 is oxidized and has a side wall oxide 25 and also a gate dielectric portion 27 thickened in the shape of a wedge as a bird's beak structure.

Figure 9:
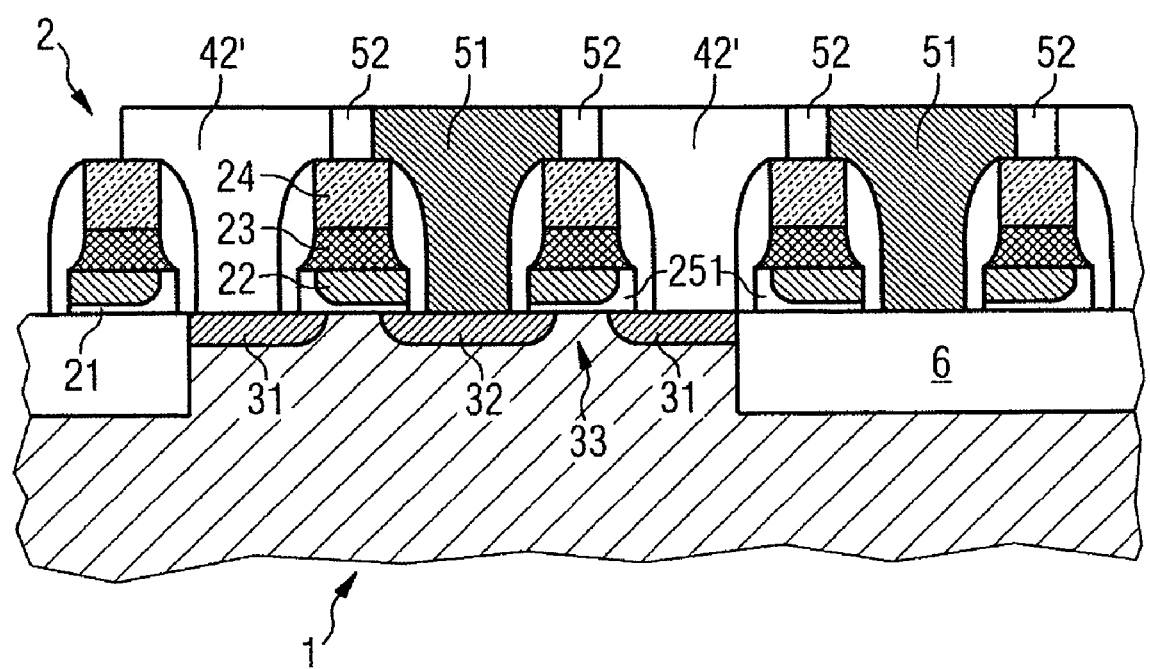
FIG. 9 shows an arrangement with memory cells with stacked capacitors in accordance with a further exemplary embodiment of the invention.

FIG. 9 illustrates a memory cell according to the invention with stacked capacitors for a different layout. Similarly to the MINT layout which has already been discussed, two memory cells are arranged mirror-symmetrically with respect to a mirror plane, select transistors 3 which are adjacent to one another being connected to the same data line contact 51. The statements which have been made in connection with FIG. 7 also apply accordingly to the arrangement of the side walls 201, 202 and the single-sided formation of the side wall oxide and/or the bird's beak structure.

FIG. 10 illustrates three phases of a first exemplary embodiment of the method according to the invention. A gate dielectric layer 21', a layer of the material of the base portion 22, a further layer of the material of the highly conductive portion 23 and a layer of the material of the insulator portion 24 were applied in succession to a substrate surface 10 of a semiconductor substrate 1 and patterned by a photolithographic step. The result of the patterning step is address lines 53 which run parallel and next to one another and in portions form gate electrodes of the select transistors 3.

Trench capacitors 4 were formed in the semiconductor substrate 1 during a prior processing operation. A filling of the trench 4 includes a conductive material forms a storage electrode 42, which in the illustrated excerpt is insulated from the surrounding semiconductor substrate 1 by a collar insulator 45. In the region of a buried strap window 46, the storage electrode 42 directly adjoins the surrounding semiconductor substrate 1. A buried strap outdiffusion 48 has been formed through outdiffusion of a dopant through the buried strap window 46. The storage electrode 42 is insulated from the gate conductor structure 2 above it by a top trench oxide 47. A shallow isolator structure 6' for isolating the memory cells is provided between two adjacent trench capacitors 4.

After patterning of the gate conductor structure 2, a photoresist layer 70 which fills the trenches between the gate conductor structures 2 is applied.

Figure 10A:
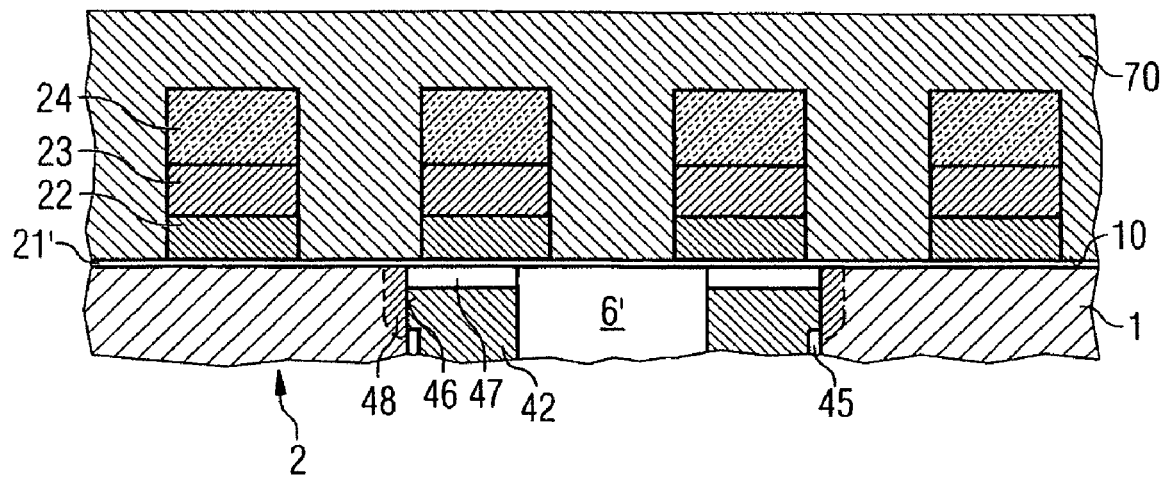
FIGS. 10A, 10B and 10C show another portion of a memory cell array in three phases of a first exemplary embodiment of the method according to the invention.

FIG. 10A shows a cross section through the trench capacitors 4 formed beneath the substrate surface 10 and four gate conductor structures 2. The photoresist layer 70 covers the gate conductor structures 2 and fills the trenches located between them.

The photoresist layer 70 is exposed by a photolithographic mask. The exposed or unexposed portion of the photoresist, depending on the type and composition of the material of the photoresist layer is caused to recede selectively with respect to the respective other portion.

Figure 10B:
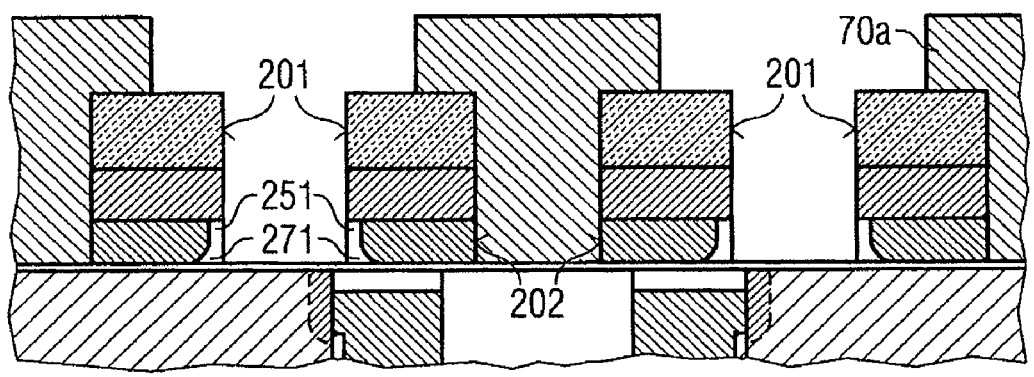

FIG. 10B reveals the photoresist mask 70a, which has been produced from the patterning of the photoresist layer 70. The photoresist mask 70a covers side walls 202 of the gate conductor structures 2, which are intended for connection to the data line. As the process continues, as described in more detail, for example, with reference to FIG. 13 below, the side wall oxide 251 or bird's beak structure 271 is formed in the portions or side walls of the gate conductor structure 2, which are not covered by the photoresist mask 70a.

The photoresist mask 70a is removed and gate stack spacers 26 are provided at the side walls 201, 202. First and second source/drain regions 31, 32 are formed by implantation in those portions of the semiconductor substrate 1 which are not covered by the gate conductor structures 2.

Figure 10C:
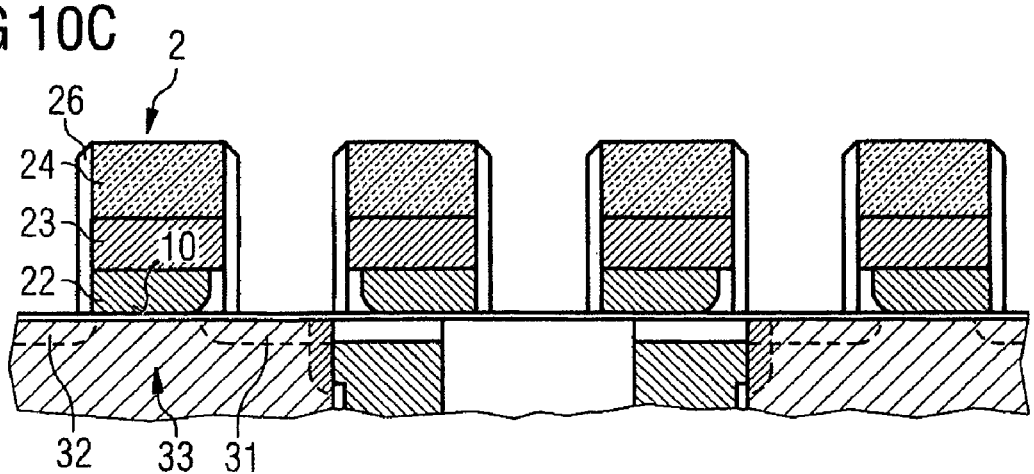
Figure 11A:
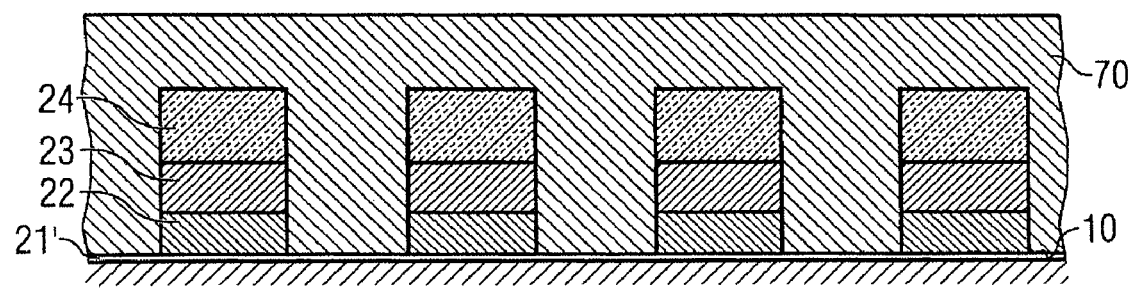
FIGS. 11A, 11B, and 11C show an arrangement with transistor structures in three phases of a second exemplary embodiment of the method according to the invention.
Figure 11B:
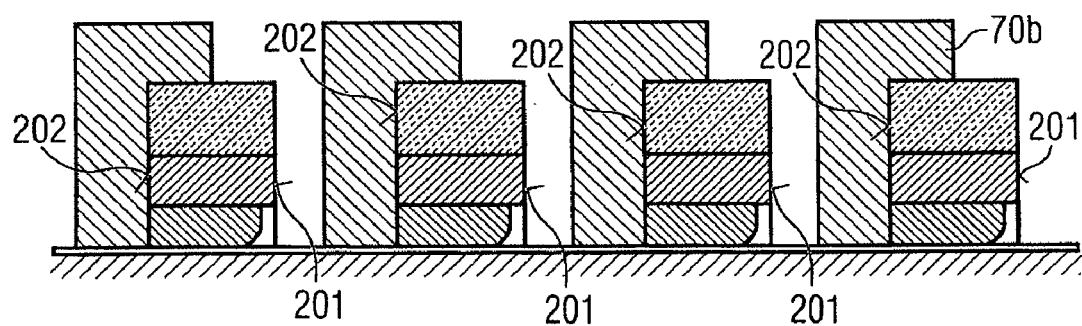
Figure 11C:
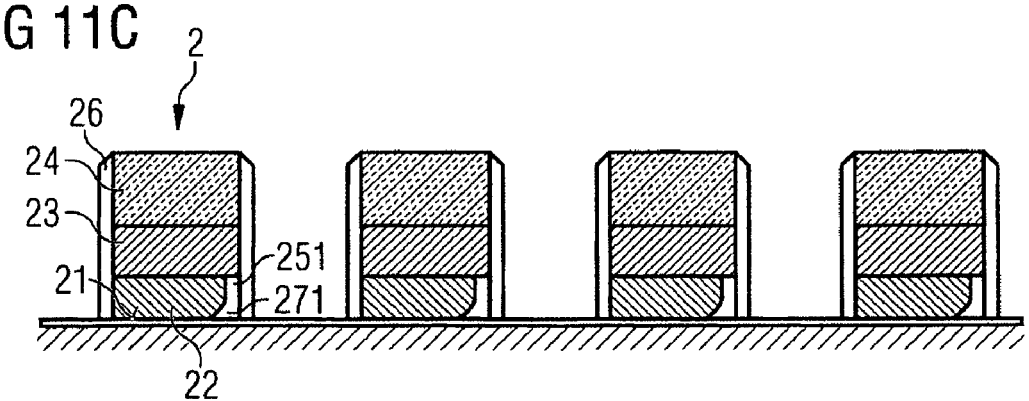

FIGS. 11A–11C show the method from FIGS. 10A–10C for a checker board layout. In a layout of this type, the memory cells are oriented in the same way. The position of a structure which is to be insulated relative to the transistor structure is relatively identical. Accordingly, the side wall oxidation process is to be carried out on the same side, in the example illustrated on the right-hand side, for the transistor structures. A resulting photoresist mask 70*b* covers side walls 202, which are oriented to the second source/drain region 32, whereas the side walls 201 assigned to the first source/drain region 31 are uncovered. The single-sided side wall oxidation is carried out in the base portion 22 at the first side walls 201.

Figure 12A:
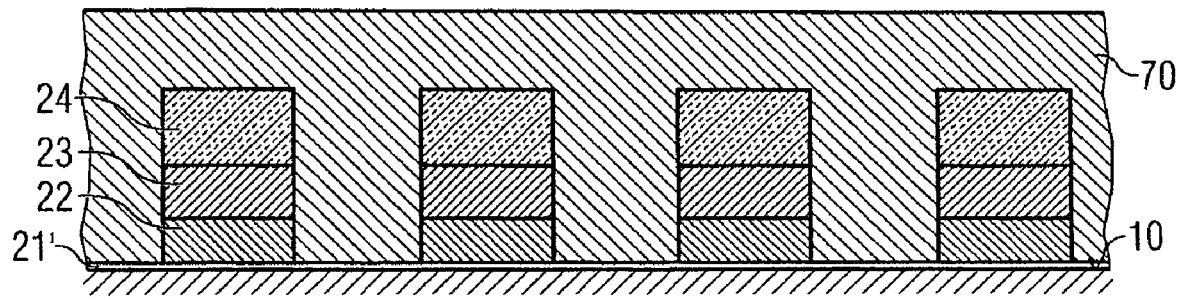
Figure 12B:
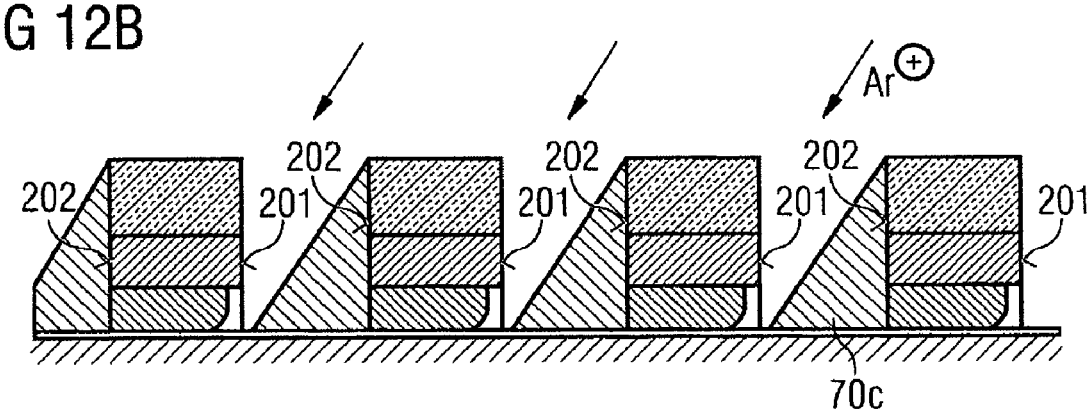
Figure 12C:
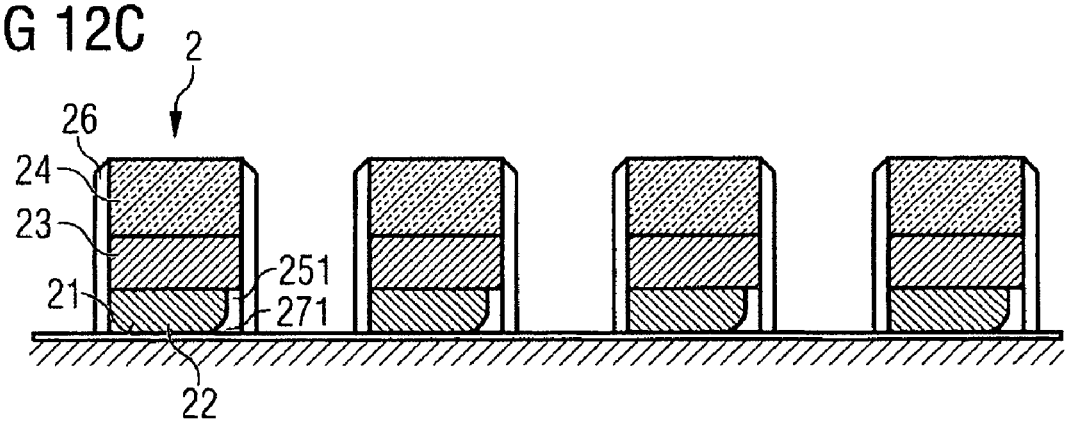

The method which has been illustrated with reference to the drawings shown in FIGS. 12A–12C, like that shown in FIGS. 11A–11C, relates to a layout in which the transistor structures are oriented in the same way. Unlike in the preceding exemplary embodiment, the exposure takes place not in a direction which is vertical with respect to the substrate surface 10 and with the aid of a photolithographic mask, but rather obliquely with respect to the substrate surface 10. In this case, the gate conductor structure 2 itself serves as a mask as a result of the material of the photoresist layer 70 in each case remaining unchanged in the exposure shadow on that side of the gate conductor structure 2 which is remote from the exposure source. After the exposed portions of the photoresist layer 70 have been etched selectively with respect to the unexposed portions, the photoresist mask 70*c* illustrated in FIG. 12B results. The angle for the exposure is selected in precisely such a way that the base portion 22 of the adjacent gate conductor structure 2 is not shadowed by the adjacent gate conductor structure 2 facing the exposure source. After the photoresist mask 70*c* has been formed, the base portion 22 can be oxidized on one side.

The photoresist masks formed in accordance with one of the above examples are generally not used directly for masking the side wall oxide. In accordance with FIGS. 13A and 13B, first of all the photoresist mask is in each case used to transfer the pattern of the mask into an interlayer 71, which then serves as a mask for the actual oxidation process. A procedure of this type has been recorded as an example of the previous exemplary embodiments in the drawings shown in FIGS. 13A and 13B.

For this purpose, a layer stack includes a gate dielectric layer 21', a semiconductor material 22', a highly conductive material 23, and an insulator material 24 is deposited on the substrate surface 10 of a semiconductor substrate 1. A gate conductor structure 2 is produced from the layer system with the aid of a photolithographic mask. A thin, conformal silicon nitride layer which is several nanometers thick, is deposited on the gate conductor structure 2. A photoresist mask 70*b* corresponding to the example shown in FIG. 11 is produced.

Figure 13A:
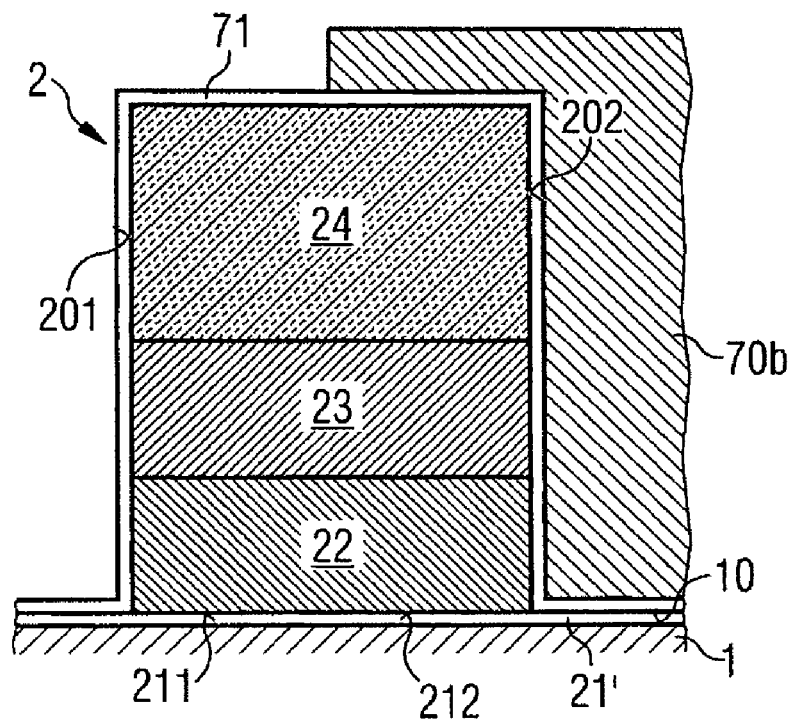
FIGS. 13A, 13B, 13C and 13D show an arrangement with transistor structures in four phases of a fourth exemplary embodiment of the method according to the invention.

FIG. 13A illustrates the photoresist mask 70*b*, which partially covers the interlayer 71 deposited on the gate conductor structure 2. The interlayer 71 is removed in the portions which are not covered by the photoresist mask 70.

Figure 13B:
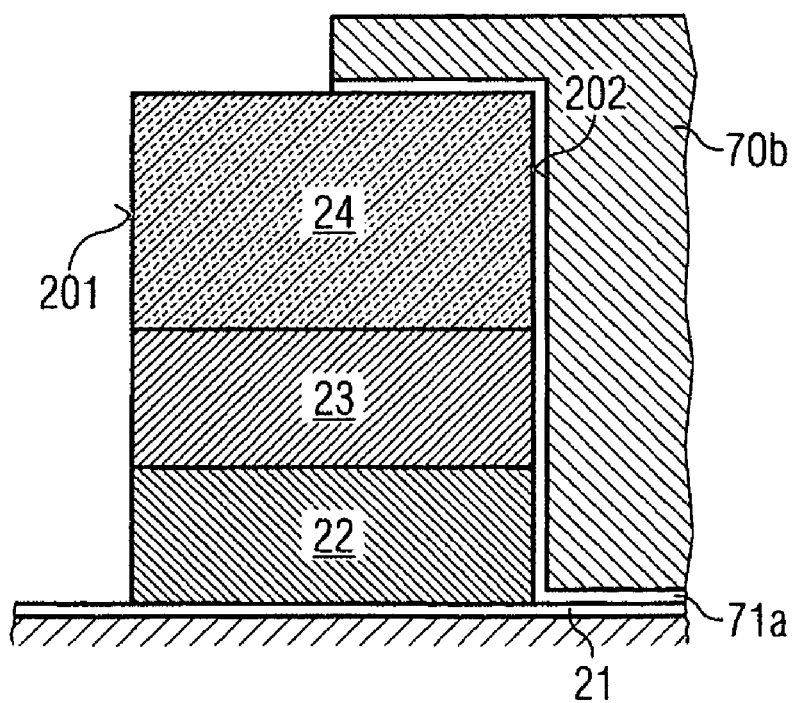
Figure 13C:
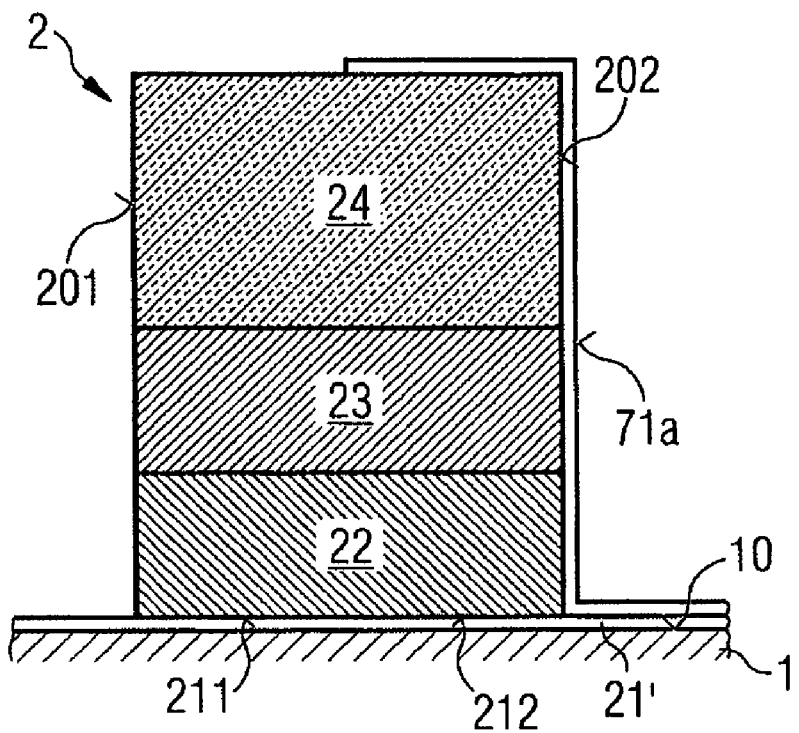
Figure 13D:
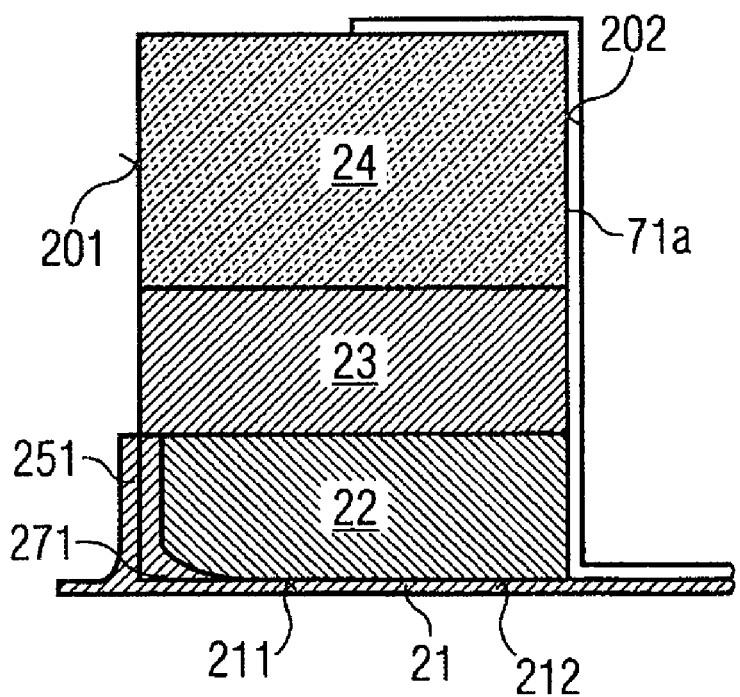

FIG. 13B illustrates the interlayer mask 71*a*, which has been patterned analogously to the photoresist mask 70*a*. The interlayer mask 71*a* covers a second side wall 202 of the gate conductor structure 2. The interlayer mask 71*a* is absent on a side wall 201, which is on the opposite side from the second side wall 202.

The photoresist mask 70*b* is removed. All that remains as the mask is the interlayer mask 71*a*.

An oxidation process is controlled. The oxidation process is carried out at those portions of the gate dielectric layer 21' along the uncovered side wall 201 of the base portion 22, which are not covered by the interlayer mask 71*a*, and also to a reduced extent, provided that the highly conductive portion 23 does not have tungsten silicide or has not been inactivated in a previous process, in the highly conductive portion 23. In a first gate dielectric portion 211, the gate dielectric layer 21' becomes thicker in the shape of a wedge in the direction of the side wall 201 and forms a bird's beak structure 271. A side wall oxide 251 is formed at the uncovered side wall 201 of the base portion 22. An oxidation process is suppressed in the second gate dielectric portion 212 on the opposite side from the first gate dielectric portion 211.

Figure 14A:
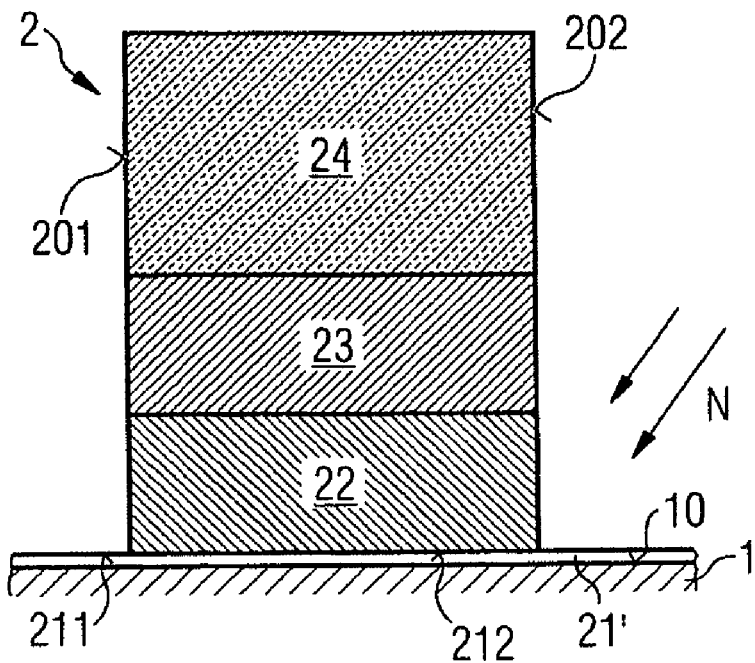
FIGS. 14A and 14B show an arrangement with transistor structures in two phases of a fifth exemplary embodiment of the method according to the invention.
Figure 14B:
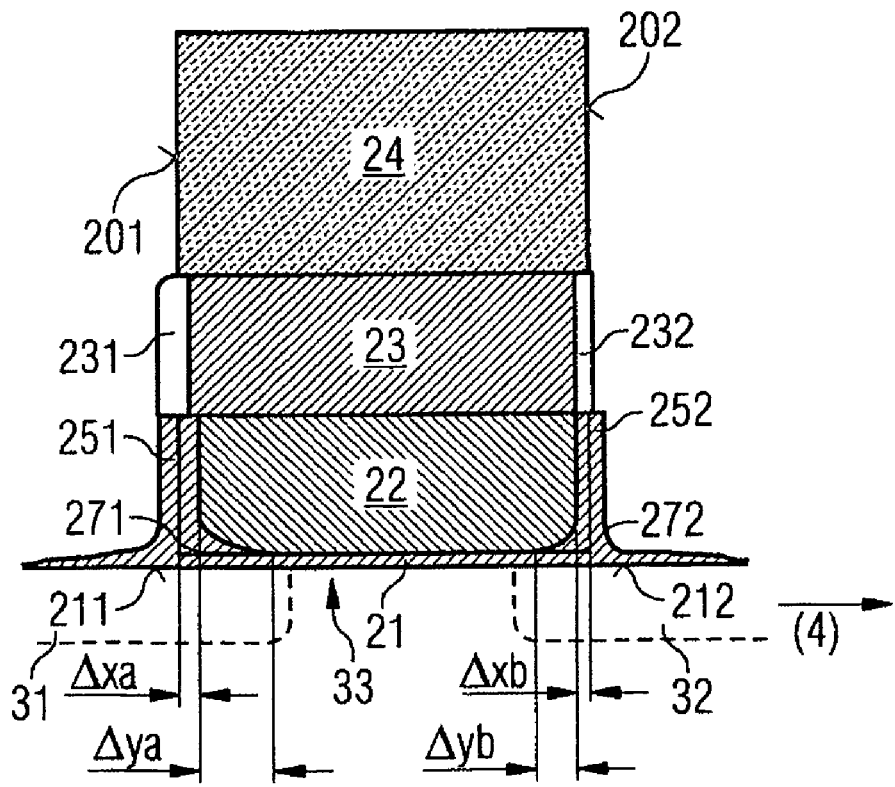

FIGS. 14A and 14B illustrate a further exemplary embodiment of the method according to the invention. A gate dielectric layer 21' is applied to a substrate surface 10 of a semiconductor substrate 1. A gate conductor structure 2 is formed and includes a base portion 22, a highly conductive portion 23, and an insulator portion 24, is then formed. A first side wall 201 faces a first source/drain region 32, which is connected to a structure to be insulated. A second side wall 202 is on the opposite side from the first side wall 201. An oblique implantation with nitrogen is carried out, with the second side wall 202 facing the implantation and the first side wall 201 facing away from the implantation. The nitrogen is incorporated, in particular, by the base portion 22 in the region of the side wall 202 and by a portion of the gate dielectric layer 21', which is oriented to the second side wall 202.

The incorporation of nitrogen reduces the oxidation process at the relevant portions of the base portion 22 and in the corresponding portion of the gate dielectric layer 21. The side wall oxide 252 on the second side wall 202 and a second bird's beak structure 272 on the same side are reduced compared to the corresponding side wall oxide 251 on the first side and the first bird's beak structure 271, which is oriented to the first side wall. The same also applies to the formation of oxide in the region of the highly conductive portion 231, 232. At the first side wall, the effective gate length is reduced by the amount $\Delta xa$ as a result of the side wall oxidation and by the amount $\Delta ya$ as a result of the bird's beak formation. At the second side wall 202, the effective gate length is correspondingly reduced by the amount $\Delta xb$, which is lower than $\Delta xa$, and the amount $\Delta yb$, which is less than $\Delta ya$. The first source/drain region 31 is intended for connection to a structure which is to be insulated, for example, the storage electrode of a storage capacitor 4.

FIGS. 15 to 26 show individual method steps of a further exemplary embodiment of the method according to the invention.

A gate dielectric layer 21' is applied to a substrate surface 10 of a semiconductor substrate 1. A layer of a semiconductor material, a layer of a highly conductive material, and a layer of an insulator material are successively deposited on the gate dielectric layer 21' and patterned by a photolithographic process. Adjacent gate conductor structures 2, 2' are produced from the layers. In accordance with the patterned layer system, the gate conductor structures 2, 2' have a base portion 22, a highly conductive portion 23, and an insulator portion 24.

Figure 15:
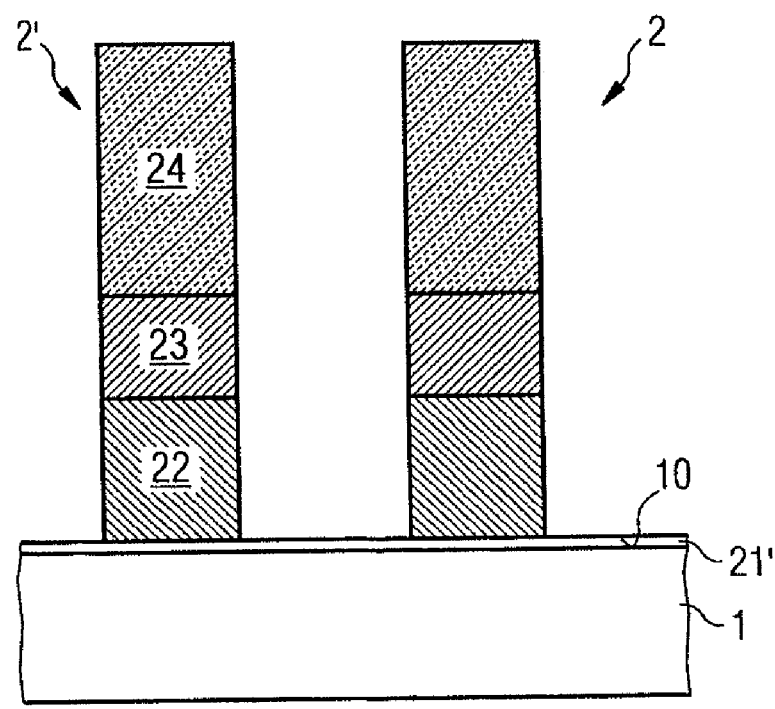
FIGS. 15 to 26 show an arrangement with transistor structures in 12 phases of a sixth exemplary embodiment of the method according to the invention.

FIG. 15 shows two adjacent gate conductor structures 2, 2', which are arranged on a gate dielectric layer 21'. The gate dielectric layer 21' is provided on a substrate surface 10 of a semiconductor substrate 1. The semiconductor substrate 1 has monocrystalline silicon, in which active areas of transistor structures are formed later in the process. Even at this time, other structures, for example, storage capacitors, can be formed in the semiconductor substrate 1. The gate dielectric layer 21 typically has silicon oxide. The base portion 22, adjoining the gate dielectric layer 21', of the gate conductor structure 2, 2' has polycrystalline silicon. The highly conductive portion 23 has tungsten, a tungsten compound or a layer system comprising tungsten-containing layers. The insulator portion 24 has silicon nitride.

A thin, conformal interlayer (nitride liner) 71 is applied to the gate conductor structure 2.

Figure 16:
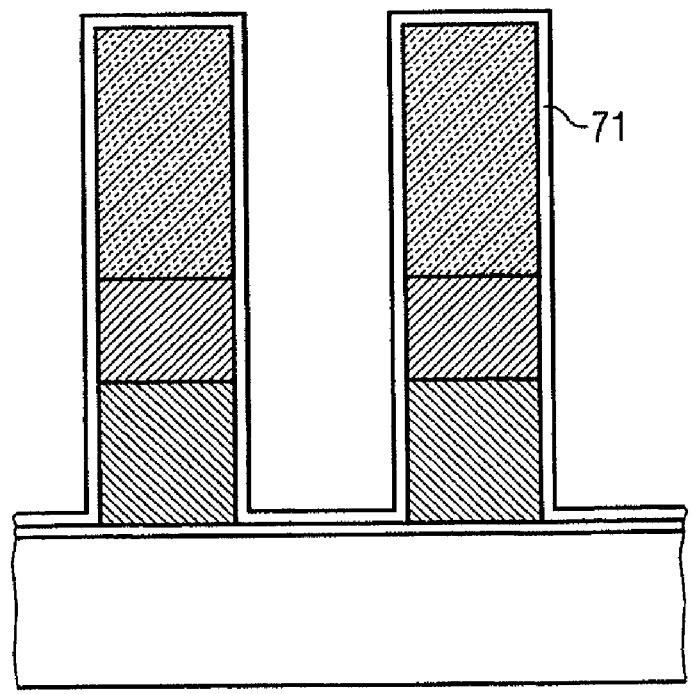

FIG. 16 shows the gate conductor structure 2 covered by the interlayer 71. The thickness of the interlayer 71 is approximately 1 to 5 nanometers.

A mask layer 72 is deposited conformally on the interlayer 71. The material of the mask layer 72 is amorphous silicon. The thickness of the mask layer 72 is approximately 10 nanometers.

Figure 17:
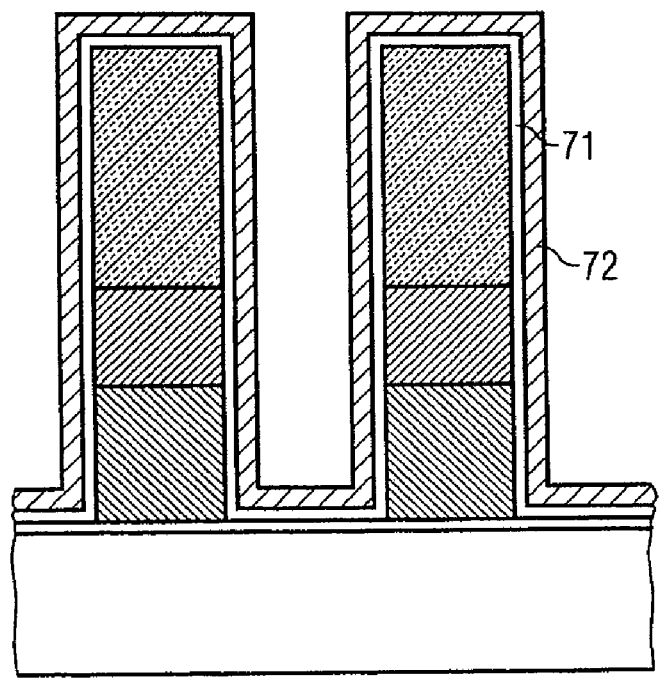

FIG. 17 illustrates the mask layer 72 deposited on the interlayer 71.

Figure 18:
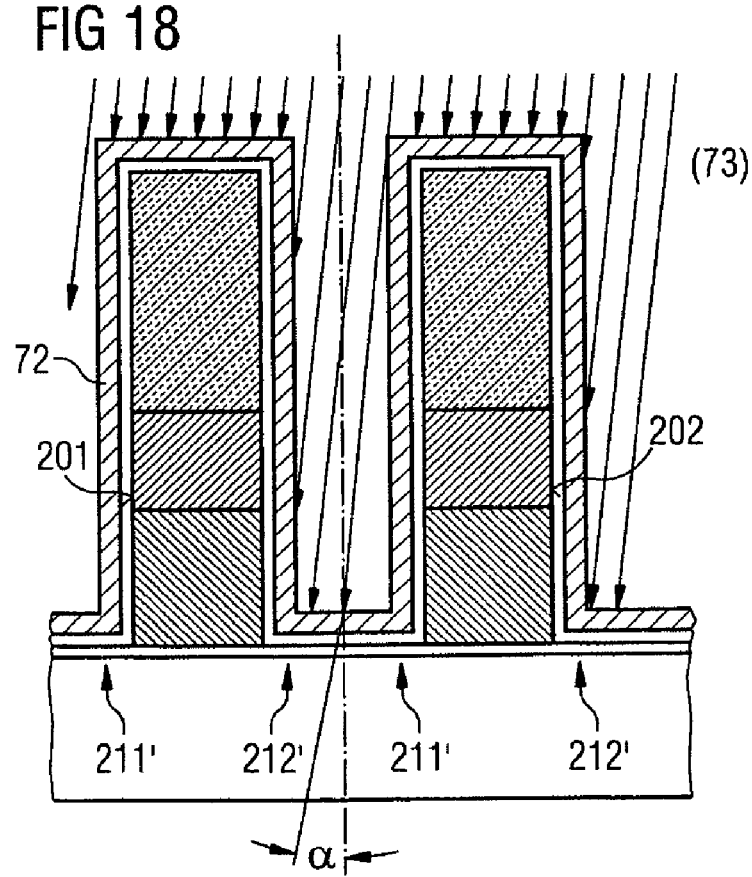

The etching resistance of the mask layer 72 is altered in portions by an α-oblique implantation 73. The oblique implantation is carried out at an angle α with respect to the vertical to the substrate surface 10. A first side wall 201 of the gate conductor structure 2 faces away from the implantation source. The etching resistance of the mask layer 72 remains substantially unaltered in the region of the first side wall 201. The angle α is selected such that the second side wall 202, which faces the implantation source, and a second portion 212', which is oriented to the second side wall 201, of the gate dielectric layer are accessible to the implantation. The first portions 211', facing the first side wall 201, of the gate dielectric layer are in the shadow of the associated gate conductor structure 2 with respect to the angled implantation. The conditions during implantation are illustrated in FIG. 18.

Figure 19:
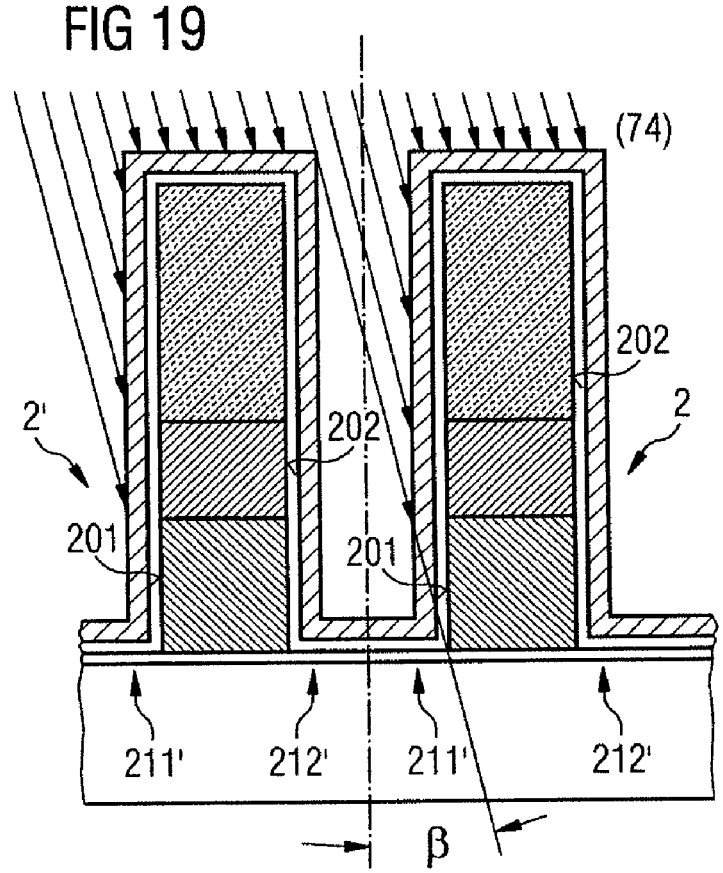

A further implantation is optionally carried out at an angle β, by which the mask layer 72 on the first side wall 201 is implanted. The angle is selected such that, by being covered by the respectively adjacent gate conductor structure 2, the second dielectric portion 212' and a lower portion of the side wall 201 are not implanted in the region of the base portion 22. This second, optional implantation draws the mask provided for side wall oxidation over the vertical portions of the highly conductive portion 23 on the first side wall 201. The β-oblique implantation 74 is illustrated in FIG. 19.

Figure 20:
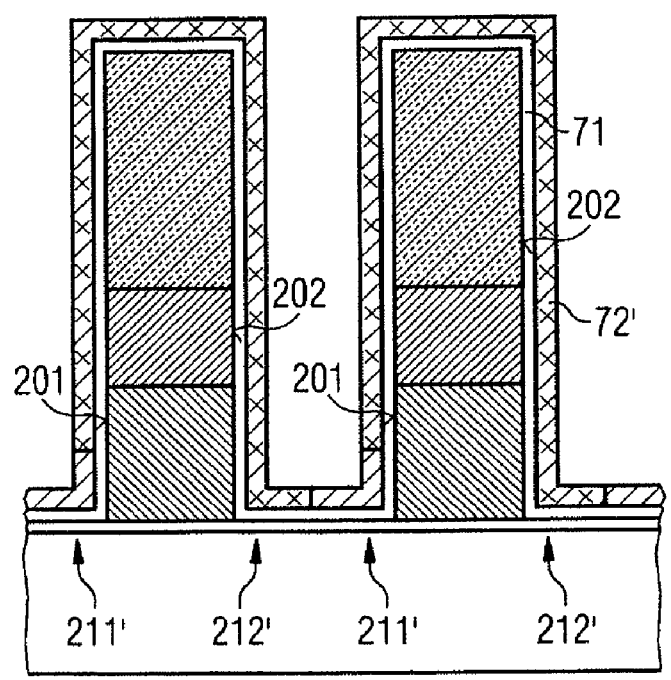

The result of the α-oblique implantation 73 in conjunction with the optional β-oblique implantation 74 is an implanted mask layer 72', which has hardened in portions, as illustrated in FIG. 20.

The unimplanted portions of the implanted mask layer 72' are removed selectively with respect to the implanted portions of the implanted mask layer 72', with a patterned mask layer mask 72a being produced from the mask layer.

Figure 21:
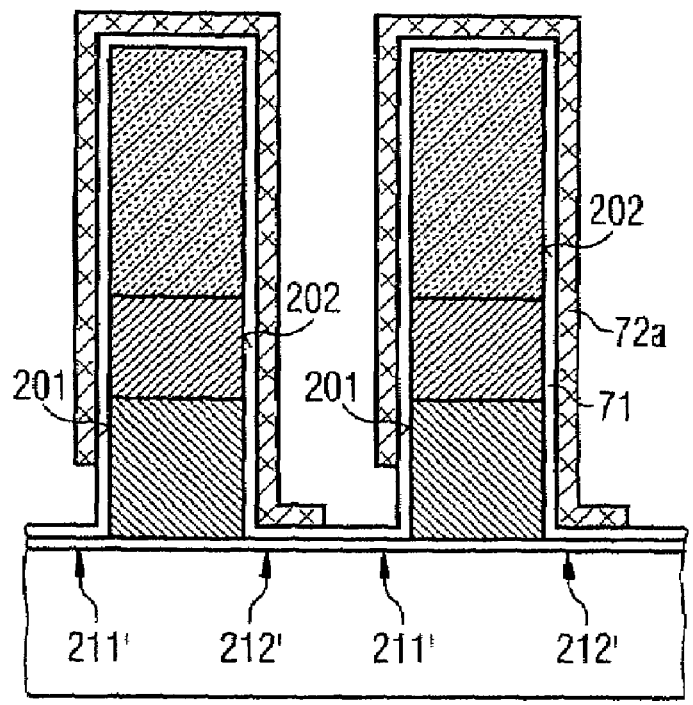
Figure 22:
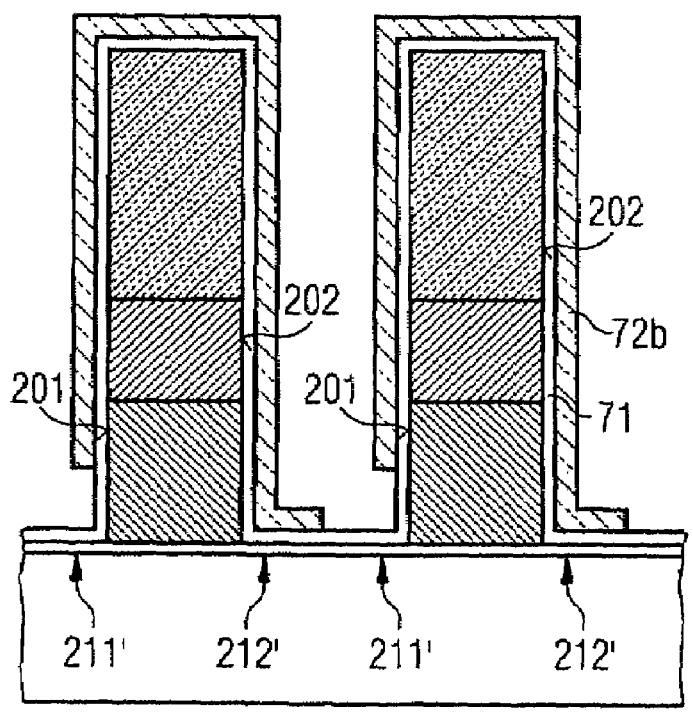

FIG. 21 illustrates the mask layer mask 72a, which rests on the interlayer 71 with the exception of a first portion on the first side wall 201 in the lower region of the base portion 22 and a first portion 211' of the dielectric layer 21'.

The mask layer mask 72a can then optionally be hardened in an oxidation process. A hardened mask layer mask 72b of silicon oxide is formed from the mask layer mask 72a.

Portions of the interlayer 71, which are not covered by the hardened mask layer, mask are removed, for example, by a wet etch in hot phosphoric acid.

Figure 23:
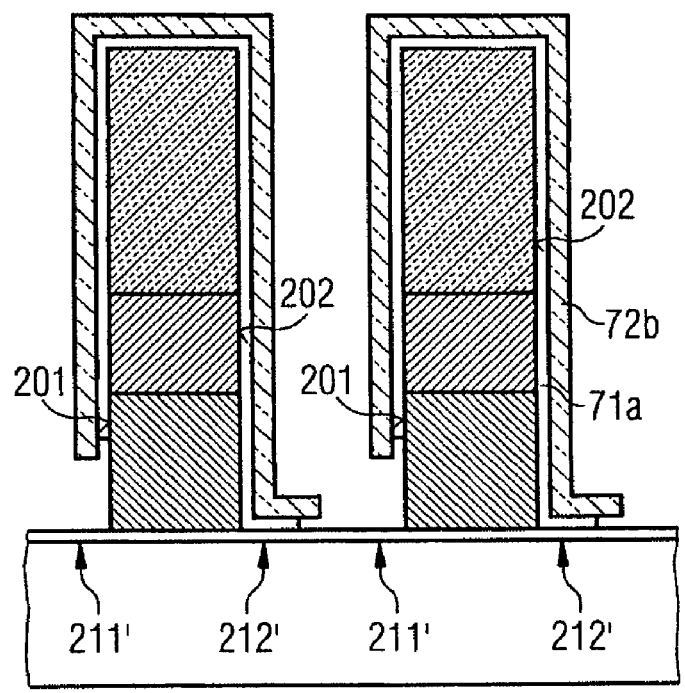

FIG. 23 shows the interlayer 71a, which has now been patterned. With the interlayer 71 receding, the hardened mask layer mask 72b on top of the interlayer 71 is partially undercut-etched. This is followed by the side wall oxide being formed on one side.

Figure 24:
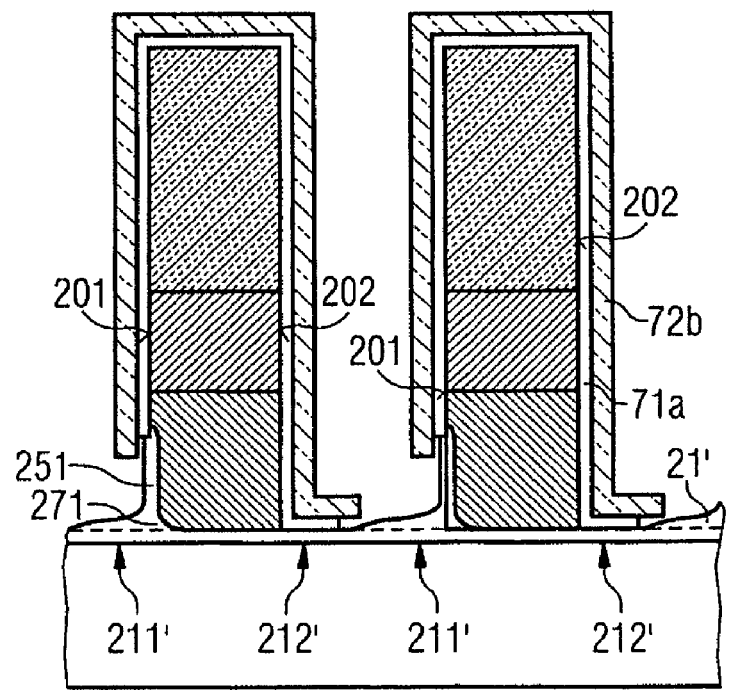

The result of the single-sided side wall oxidation is illustrated in FIG. 24. The side wall oxide 251 or the bird's beak structure 271 has been formed in those portions of the base portion 22 of the gate conductor structures 2, 2' which are not covered by the interlayer mask 71a. The bird's beak structure 271 is produced as a result of the gate dielectric layer 21' being thickened in the portions which are not covered by the interlayer mask 71a.

A spacer etch, for example, an anisotropic etch, removes the hardened mask layer mask 72b, the interlayer mask 71a, and portions of the gate dielectric layer 21' from the horizontal regions, in particular, from the region of the trench base between the two gate conductor structures 2, 2'.

Figure 25:
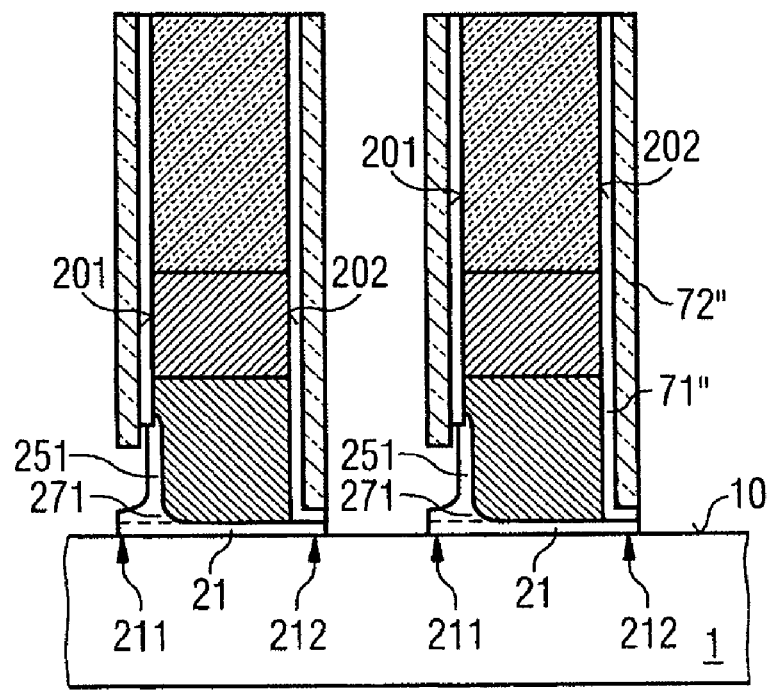

As a result of the spacer etch, as illustrated in FIG. 25, the vertical side walls 201, 202 remain covered by residual portions of the mask layer 72' and the interlayer 71". The semiconductor substrate 1 is uncovered at the substrate surface in the region between the gate conductor structures 2.

The protective layer provided is a screen oxide 75, produced, for example, by means of a TEOS (tetraethyl orthosilane) process, which covers the gate conductor structures 2, 2' as a conformal layer.

Figure 26:
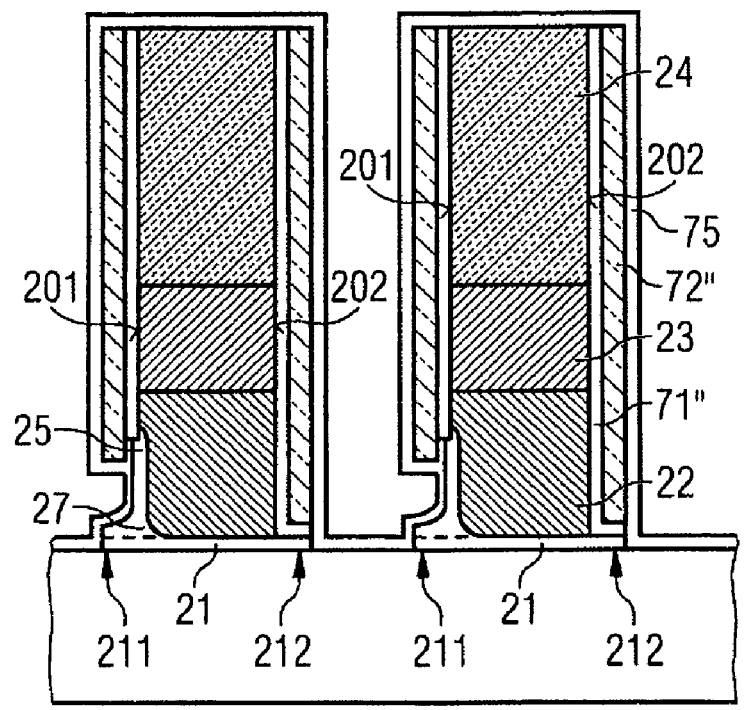

FIG. 26 shows the screen oxide 75 as a thin, conformal layer.

Figure 27:
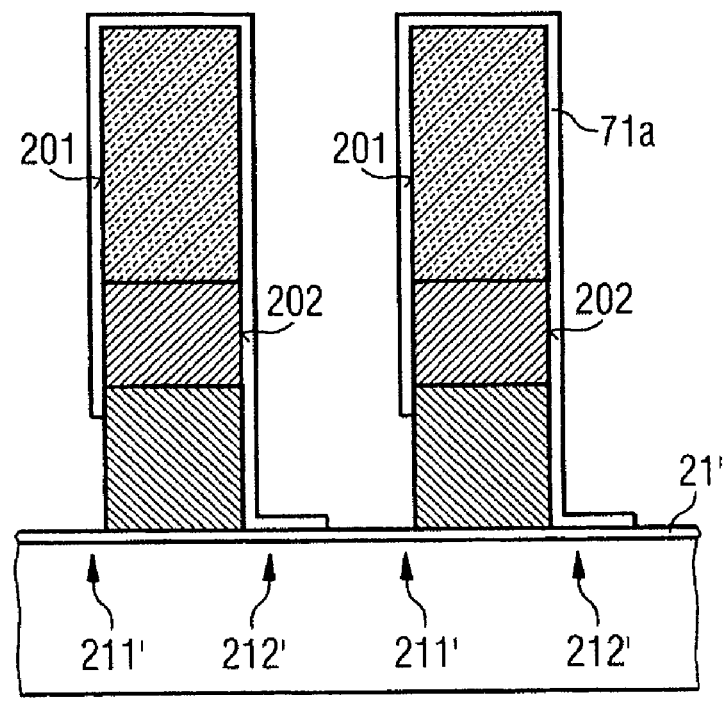
FIGS. 27 to 28 show an arrangement with transistor structures in two phases of a seventh exemplary embodiment of the method according to the invention.
Figure 28:
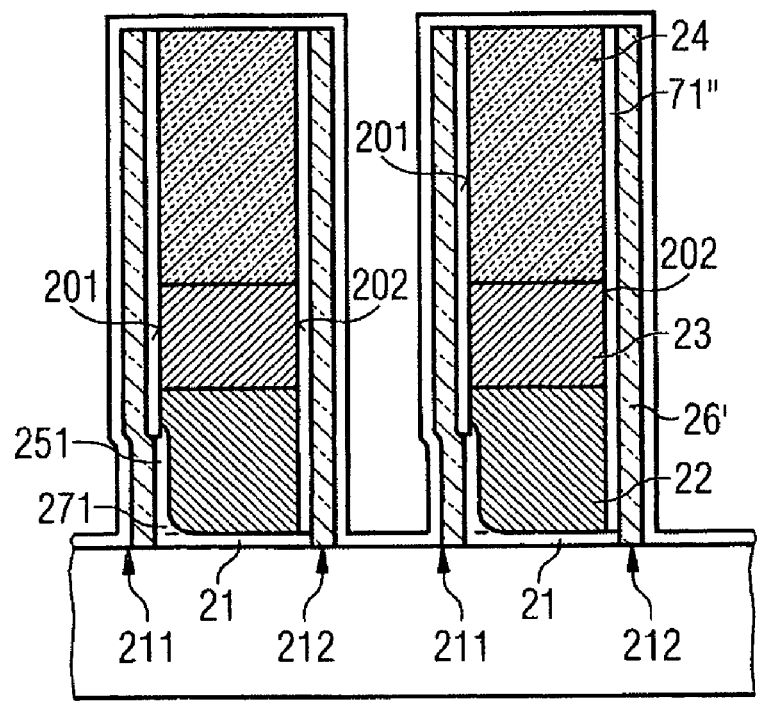

A further exemplary embodiment of the method according to the invention is illustrated in FIGS. 27 and 28, which follow on from FIG. 23 of the preceding exemplary embodiment.

Starting from FIGS. 21 or 23, the mask layer mask 72a or the hardened mask layer 72b is removed after the interlayer 71 has been patterned.

FIG. 27 illustrates the interlayer mask 71a, which, unlike in the previous example, is no longer covered by a hardened or unhardened mask layer mask. Forming the gate stack spacers 26' then requires an additional, conformal deposition of a spacer material.

FIG. 28 corresponds to FIG. 26, except that the gate stack spacers 26 have been produced from a conventional spacer etch.

While the invention has been described in detail and with reference to specific embodiments thereof, it will be apparent to one' skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Semiconductor substrate
10 Substrate surface
2, 2' Gate conductor structure
20 Side wall
201 First side wall
202 Second side wall
21 Gate dielectric
211 First gate dielectric portion
212 Second gate dielectric portion
21' Gate dielectric layer
211' First portion
212' Second portion
22 Base portion
23 Highly conductive portion
231 Oxidation portion on first side wall
232 Oxidation portion on second side wall
24 Insulator portion (cap nitride)
25 Side wall oxide
251 Side wall oxide on first side wall
252 Side wall oxide on second side wall
26 Gate stack spacer 26' Gate stack spacer
27 Bird's beak structure
271 First bird's beak structure
272 Second bird's beak structure
3 Select transistor
31 First source/drain region
32 Second source/drain region
33 Channel region
4 Storage capacitor
4' Stacked capacitor
41 Trench
42, 42' Storage electrode
43, 43' Counterelectrode
44, 44' Capacitor dielectric
45 Collar insulator
46 Buried strap window
47 Top trench oxide (TTO)
48 Buried strap outdiffusion
5 Data line
51 Data line contact
511 Silicide boundary layer
52 Data line insulator
53 Address line
6, 6' Shallow isolator structure (STI)
7 Mask
70 Photoresist layer
70a Photoresist mask
70b Photoresist mask
70c Photoresist mask
71 interlayer
71' Patterned interlayer
71" Remaining interlayer
71a Interlayer mask
72 Mask layer
72' Implanted mask layer
72" Remaining mask layer
72a Mask layer mask
72b Hardened mask layer mask
73 α-oblique implantation
74 β-oblique implantation
75 Screen oxide
8 Memory cell
81 Cell array
82 Cell row
83 Cell column

We claim:

1. A method for fabricating a transistor structure, comprising:
providing a gate dielectric layer on at least a portion of a surface of a semiconductor substrate;
applying a base layer of a conductive material to the gate dielectric layer;
patterning the base layer so as to produce a base portion of a gate conductor structure;
providing a first side wall oxide on a first side wall of the base portion and a second side wall oxide on a second side wall of the base portion, wherein the first and second side walls are substantially vertical with respect to the substrate surface, and wherein the second side wall opposes the first side wall;
applying a conformal mask layer from a mask material having an etching resistance that can be altered by dopant implantation;
altering the etching resistance of portions of the conformal mask layer by an α-oblique implantation on the first side wall and/or in the gate dielectric layer;
selectively causing unaltered portions of the conformal mask layer to recede with respect to the altered portions of the conformal mask layer to produce a mask that covers at least the second side wall but not said first side wall; and
growing the first side wall oxide and the second side wall oxide from conductive material of the base portion by an oxidation process that is controlled asymmetrically by said mask to produce the first side wall oxide and the second side wall oxide such that the first side wall oxide has a greater layer thickness than the second side wall oxide.

2. The method of claim 1, and further comprising thickening portions of the gate dielectric layer by an oxidation process that is controlled asymmetrically by said mask so as to form a first gate dielectric portion that is in a shape of a wedge and oriented to the first side wall and a second gate dielectric portion that is in a shape of a wedge and oriented to the second side wall, wherein the first gate dielectric portion has a greater thickness and/or length than the second gate dielectric portion.

3. The method of claim 1, wherein applying the conformal mask layer comprises providing an interlayer, patterning the interlayer with a mask pattern in accordance with a photoresist mask, and wherein said growing of the first side wall oxide and second side wall oxide is performed by the oxidation process through the patterned interlayer.

4. The method of claim 3, wherein providing the base layer of the conductive material comprises providing a highly conductive portion formed from tungsten or tungsten nitride, and wherein providing the interlayer comprises covering a portion of the first side wall that is formed from said highly conductive portion.

5. The method of claim 4, wherein said altering comprises altering the etching resistance of the conformal mask layer by β-oblique implantation that is directed opposite to the α-oblique implantation in a vertical direction on the first side wall outside said base portion, and further comprising providing a neighboring structure on a side of the base portion proximate said first side wall, wherein the neighboring structure prevents the implantation of a portion of the conformal mask layer by which the highly conductive portion is covered at said second wide wall in a region of said base portion and/or of the second gate dielectric portion adjoining the gate dielectric.

6. A method for fabricating a transistor structure, comprising:
providing a gate dielectric layer on at least a portion of a surface of a semiconductor substrate;
applying a base layer of a conductive material to the gate dielectric layer;
patterning the base layer so as to produce a base portion of a gate conductor structure;
providing a first side wall and a second side wall that extend from the base portion;
applying a conformal mask layer from a mask material having an etching resistance that can be altered by dopant implantation;
altering the etching resistance of portions of the conformal mask layer by an α-oblique implantation on the first side wall and/or in the gate dielectric layer;
selectively causing unaltered portions of the conformal mask layer to recede with respect to the altered portions of the conformal mask layer to produce a mask that covers at least the second side wall but not said first side wall;

thickening portions of the gate dielectric layer by an oxidation process that is controlled asymmetrically by said mask so as to form a first gate dielectric portion that is in a shape of a wedge and oriented to the first side wall and a second gate dielectric portion that is in a shape of a wedge and oriented to the second side wall, wherein the gate dielectric portion has a greater thickness and/or length than the second gate dielectric portion.

7. The method of claim 6, wherein applying the conformal mask layer comprises providing an interlayer, patterning the interlayer with a mask pattern in accordance with a photoresist mask, and wherein said growing of the first side wall oxide and second side wall oxide is performed by the oxidation process through the patterned interlayer.

8. The method of claim 7, wherein providing the base layer of the conductive material comprises providing a highly conductive portion formed from tungsten or tungsten nitride, and wherein providing the interlayer comprises covering a portion of the first side wall that is formed from said highly conductive portion.

9. The method of claim 8, wherein said altering comprises altering the etching resistance of the conformal mask layer by β-oblique implantation that is directed opposite to the α-oblique implantation in a vertical direction on the first side wall outside said base portion, and further comprising providing a neighboring structure on a side of the base portion proximate said first side wall, wherein the neighboring structure prevents the implantation of a portion of the conformal mask layer by which the highly conductive portion is covered at said second wide wall in a region of said base portion.

* * * * *

UNITED STATES PATENT AND TRADEMARK OFFICE
CERTIFICATE OF CORRECTION

PATENT NO. : 7,183,156 B2  Page 1 of 1
APPLICATION NO. : 10/975085
DATED : February 27, 2007
INVENTOR(S) : Matthias Goldbach et al.

It is certified that error appears in the above-identified patent and that said Letters Patent is hereby corrected as shown below:

Title Page, References Cited: Add --WO 01/67498 9/2001--
(Foreign Patent Documents)

Signed and Sealed this

Twenty-ninth Day of April, 2008

JON W. DUDAS
*Director of the United States Patent and Trademark Office*